(12) United States Patent
Petro et al.

(10) Patent No.: US 6,216,147 B1
(45) Date of Patent: Apr. 10, 2001

(54) METHOD AND APPARATUS FOR AN N-NARY MAGNITUDE COMPARATOR

(75) Inventors: Anthony M. Petro; James S. Blomgren, both of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/206,906

(22) Filed: Dec. 7, 1998

Related U.S. Application Data

(60) Provisional application No. 60/069,250, filed on Dec. 11, 1997.

(51) Int. Cl.[7] .................................. G06F 7/50; G05B 1/00
(52) U.S. Cl. ........................ 708/671; 708/710; 340/146.2
(58) Field of Search ..................................... 708/700, 706, 708/710, 713, 670–671; 340/146.2

(56) References Cited

U.S. PATENT DOCUMENTS

| | | | | |
|---|---|---|---|---|
| 4,163,211 | * | 7/1979 | Miura | 340/146.2 |
| 5,463,571 | * | 10/1995 | Kim et al. | 708/670 |
| 5,463,572 | * | 10/1995 | Kim et al. | 708/670 |

* cited by examiner

*Primary Examiner*—Tan V. Mai
(74) *Attorney, Agent, or Firm*—Booth & Wright, L.L.P.; Matthew J. Booth

(57) ABSTRACT

The present invention is a magnitude comparator that receives as inputs two 32-bit 1-of-4 operands. The magnitude comparator generates a carry indicator if the value of the first operand is less than or equal to the value of the second operand. The magnitude comparator generates a no carry indicator if the value of the first operand is greater than the value of the second operand.

8 Claims, 12 Drawing Sheets

METHOD AND APPARATUS FOR AN N-NARY MAGNITUDE COMPARATOR

This application claims the benefits of the earlier filed U.S. Provisional Application Ser. No. 60/069250, filed Dec. 11, 1997, which is incorporated by reference for all purposes into this application.

BACKGROUND OF THE INVENTION

1. Field of the Invention

The present invention relates to digital computing, and more particularly to an apparatus and method for a magnitude comparator.

2. Description of the Related Art

An often-useful degenerate form of an adder is a magnitude comparator, which detects whether one number has a greater or lesser value than another. Comparators are particularly useful in bounds checking situations, where only a binary relationship between two numbers is necessary, since comparators are considerably less complex than full adders. Because a comparator does not utilize sum logic but rather comprises only carry chain logic, it is simpler in structure than a full adder. (An example of a full adder is set forth in co-pending application, U.S. Pat. App. Ser. No. 09/206,463, filed Dec. 7, 1998, and entitled "Method and Apparatus for 3-stage 32-bit Adder/Subtractor," hereinafter referred to as "the 3-stage Adder Application.")

Traditional Binary Addition

In most computer systems, addition and subtraction of numbers is supported. The present invention requires support of the subtraction function. The following discussion of addition sets the foundation for the subtraction discussion that follows.

In systems using traditional binary logic, the truth table for one-bit addition is set forth in Table 1.

TABLE 1

| A | B | A + B |
|---|---|---|
| 0 | 0 | 0 |
| 0 | 1 | 1 |
| 1 | 0 | 1 |
| 1 | 1 | 0* |

In the last row of Table 1, a carry condition occurs. That is, the result is 0, but a carry into the next-higher-order bit position, corresponding to a decimal value of 2, has conceptually occurred.

In addition to single bits, the addition operation may be performed on multiple bits, including addition of two two-bit values. The truth table for such an operation is set forth in Table 2, where the first operand A is a two-bit value comprising bits $A_0$ and $A_1$. The second operand, B, is a two-bit value comprising bits $B_0$ and $B_1$.

TABLE 2

| $A_1$ | $A_0$ | $B_1$ | $B_0$ | A = Decimal Value | B = Decimal Value | A + B | A + B = Dec. Value |
|---|---|---|---|---|---|---|---|
| 0 | 0 | 0 | 0 | 0 | 0 | 00 | 0 |
| 0 | 0 | 0 | 1 | 0 | 1 | 01 | 1 |
| 0 | 0 | 1 | 0 | 0 | 2 | 10 | 2 |
| 0 | 0 | 1 | 1 | 0 | 3 | 11 | 3 |
| 0 | 1 | 0 | 0 | 1 | 0 | 01 | 1 |
| 0 | 1 | 0 | 1 | 1 | 1 | 10 | 2 |
| 0 | 1 | 1 | 0 | 1 | 2 | 11 | 3 |
| 0 | 1 | 1 | 1 | 1 | 3 | 00* | 0 |
| 1 | 0 | 0 | 0 | 2 | 0 | 10 | 2 |
| 1 | 0 | 0 | 1 | 2 | 1 | 11 | 3 |
| 1 | 0 | 1 | 0 | 2 | 2 | 00* | 0 |
| 1 | 0 | 1 | 1 | 2 | 3 | 01* | 1 |
| 1 | 1 | 0 | 0 | 3 | 0 | 11 | 3 |
| 1 | 1 | 0 | 1 | 3 | 1 | 00* | 0 |
| 1 | 1 | 1 | 0 | 3 | 2 | 01* | 1 |
| 1 | 1 | 1 | 1 | 3 | 3 | 10* | 2 |

Each output value in the "A+B" column of Table 2 indicated with an asterisk denotes a carry condition where a one has conceptually carried into the next-higher-order bit (the bit position corresponding to a decimal value of four).

N-nary Logic

The present invention utilizes N-NARY logic. The N-NARY logic family supports a variety of signal encodings, including 1-of-4. The N-NARY logic family is described in a copending patent application, U.S. patent application Ser. No. 09/019,355, filed Feb. 5, 1998, now U.S. Pat. No. 6,066,965, and titled "Method and Apparatus for a N-Nary logic Circuit Using 1-of-4 Encoding", which is incorporated herein for all purposes and hereinafter referred to as "The N-NARY Patent." In 1-of-4 encoding, four wires are used to indicate one of four possible values. In contrast, traditional static design uses two wires to indicate four values, as is demonstrated in Table 2. In Table 2, the $A_0$ and $A_1$ wires are used to indicate the four possible values for operand A: 00, 01, 10, and 11. The two B wires are similarly used to indicate the same four possible values for operand B. "Traditional" dual-rail dynamic logic also uses four wires to represent two bits, but the dual-rail scheme always requires two wires to be asserted. In contrast, N-NARY logic only requires assertion of one wire. The benefits of N-NARY logic over dual-rail logic, such as reduced power and reduced noise, should be apparent from a reading of The N-NARY Patent.

All signals in N-NARY logic, including 1-of-4, are of the 1-of-N form where N is any integer greater than one. A 1-of-4 signal requires four wires to encode four values (0–3 inclusive), or the equivalent of two bits of information. More than one wire will never be asserted for a 1-of-N signal. Similarly, N-NARY logic requires that a high voltage be asserted for all valid values, even 0. (Some versions of N-NARY logic allow a "null" case, where no high voltage is asserted for an N-NARY signal, which indicates that the N-NARY signal has not yet evaluated, and is not required).

Any one N-NARY gate may comprise multiple inputs and/or outputs. In such a case, a variety of different N-NARY encodings may be employed. For instance, consider a gate that comprises two inputs and two outputs, where the inputs are a 1-of-4 signal and a 1-of-2 signal and the outputs comprise a 1-of-4 signal and a 1-of-3 signal. Various variables, including P, Q, R, and S, may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3.

Through the use of these, and other, additional variables, it is possible to describe multiple N-NARY signals that comprise a variety of different encodings.

SUMMARY OF THE INVENTION

The preferred embodiment of the present invention comprises a three-stage 32-bit magnitude comparator that receives as inputs two 32-bit 1-of-4 operands, A and B, and produces a 1-of-2 output. In the first level of logic, the Subtraction Logic, the first operand is subtracted from the second, and an HPG carry propagate indicator is generated for each dit of the difference between the two operands. In the second level of logic, the Block HPG Logic, an HPG carry propagate signal is generated for each five-dit block of the difference between the two operands. In the third level of logic, the Comparison Logic, a 1-of-2 carry out indicator is generated to indicate whether the subtraction of A operand from the B operand has generated a carry.

DETAILED DESCRIPTION OF THE INVENTION

The present invention relates to a three-logic-level magnitude comparator using N-NARY logic. This disclosure describes numerous specific details that include specific formats, structures, circuits, and logic functions in order to provide a thorough understanding of the present invention. One skilled in the art will appreciate that one may practice the present invention without these specific details. Additionally, this disclosure does not describe in detail some well-known structures such as N-FETs, P-FETs, nor does it describe N-NARY logic in detail, in order not to obscure the present invention.

For illustrative purposes, a truth table demonstrating the add operation using 1-of-4 encoding is set forth in Table 3. Each of the inputs A and B in Table 3 is a two-bit input that can represent one of four values, 0 through 3 inclusive, depending on which of the four wires for each signal asserted. Table 3 discards any potential input value that includes more than one wire asserted for each 1-of-4 signal, such as 1111 and 0101. Such values are undefined for the evaluate stage of 1-of-4 logic gates. The four wires for the two-bit sum of the 1-of-4 addition operation in Table 3 are labeled $S_3$, $S_2$, $S_1$, and $S_0$.

TABLE 3

| $A_3$ | $A_2$ | $A_1$ | $A_0$ | A Dec. Value | $B_3$ | $B_2$ | $B_1$ | $B_0$ | B Dec. Value | $S_3$ | $S_2$ | $S_1$ | $S_0$ | Output Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | 1 |
| 0 | 0 | 0 | 1 | 0 | 0 | 1 | 0 | 0 | 2 | 0 | 1 | 0 | 0 | 2 |
| 0 | 0 | 0 | 1 | 0 | 1 | 0 | 0 | 0 | 3 | 1 | 0 | 0 | 0 | 3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 1 | 0 | 0 | 2 |
| 0 | 0 | 1 | 0 | 1 | 0 | 1 | 0 | 0 | 2 | 1 | 0 | 0 | 0 | 3 |
| 0 | 0 | 1 | 0 | 1 | 1 | 0 | 0 | 0 | 3 | 0 | 0 | 0 | 1 | 0* |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 3 |
| 0 | 1 | 0 | 0 | 2 | 0 | 1 | 0 | 0 | 2 | 0 | 0 | 0 | 1 | 0* |
| 0 | 1 | 0 | 0 | 2 | 1 | 0 | 0 | 0 | 3 | 0 | 0 | 1 | 0 | 1* |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 0 | 0 | 1 | 0* |
| 1 | 0 | 0 | 0 | 3 | 0 | 1 | 0 | 0 | 2 | 0 | 0 | 1 | 0 | 1* |
| 1 | 0 | 0 | 0 | 3 | 1 | 0 | 0 | 0 | 3 | 0 | 1 | 0 | 0 | 2* |

In Table 3, output values with asterisks indicate that a carry is conceptually generated into a higher-order bit representing a decimal value of 4.

N-NARY Logic Circuits

Figure 1:
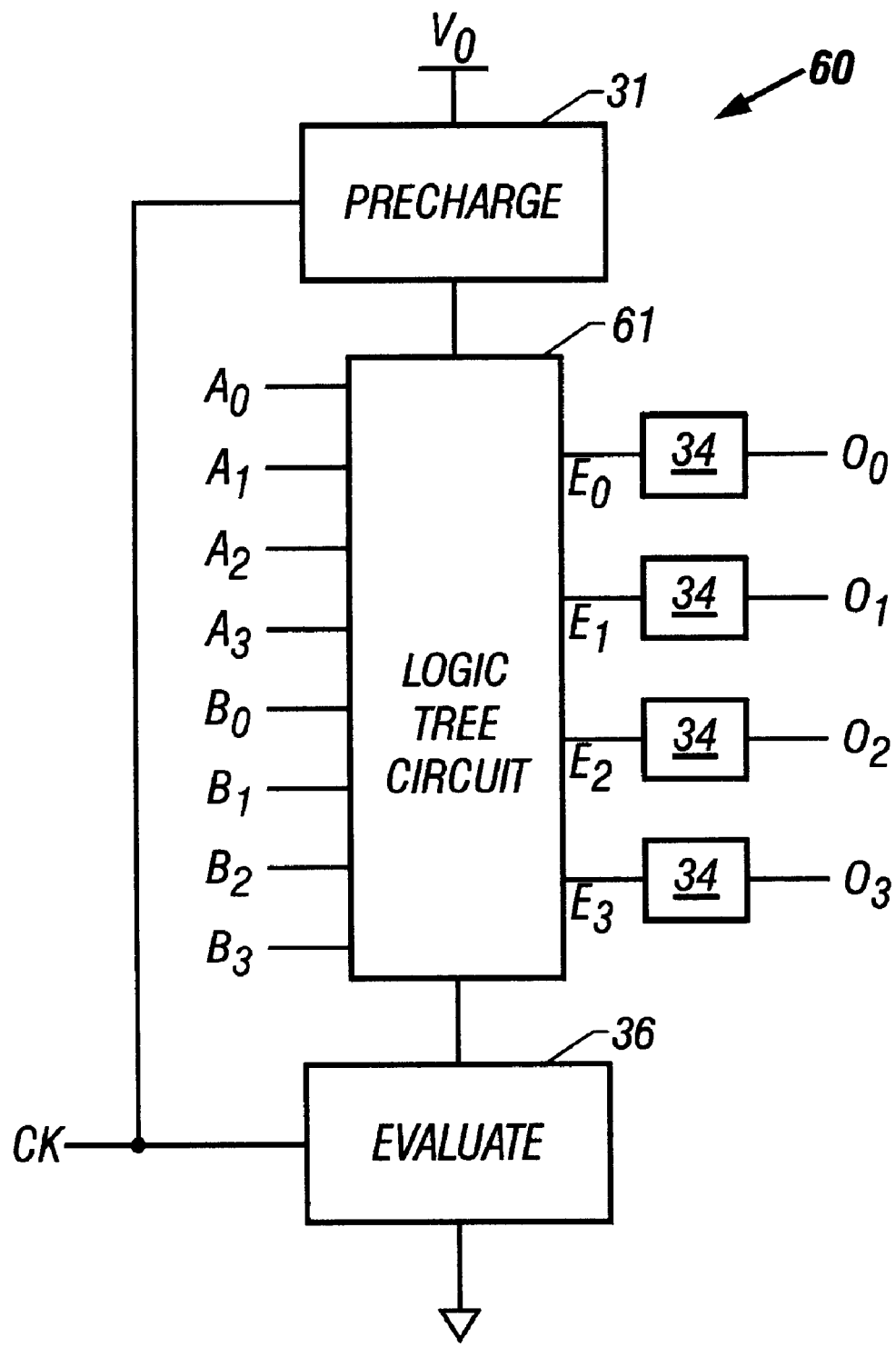
FIG. 1 is a block diagram of an N-NARY gate.

A background discussion of N-NARY circuits is in order before discussing the magnitude comparator 102 of the present invention. N-NARY logic may be used to create circuits to perform a desired function. The present invention utilizes N-NARY logic. FIG. 1 illustrates a 1-of-N logic gate 60 that uses two sets of 1-of-N signals for the inputs and produces one 1-of-N signal for the output. In gate 60, the A and B inputs comprise four wires each, with each set of wires representing 2 bits (one dit) of data. A is a one-dit input, B is a one-dit input, and 0 is a one-dit output. In other words, the N-NARY gate 60 depicted in FIG. 1 comprises 4 input bits (2 dits) and 2 output bits (one dit).

Figure 2:
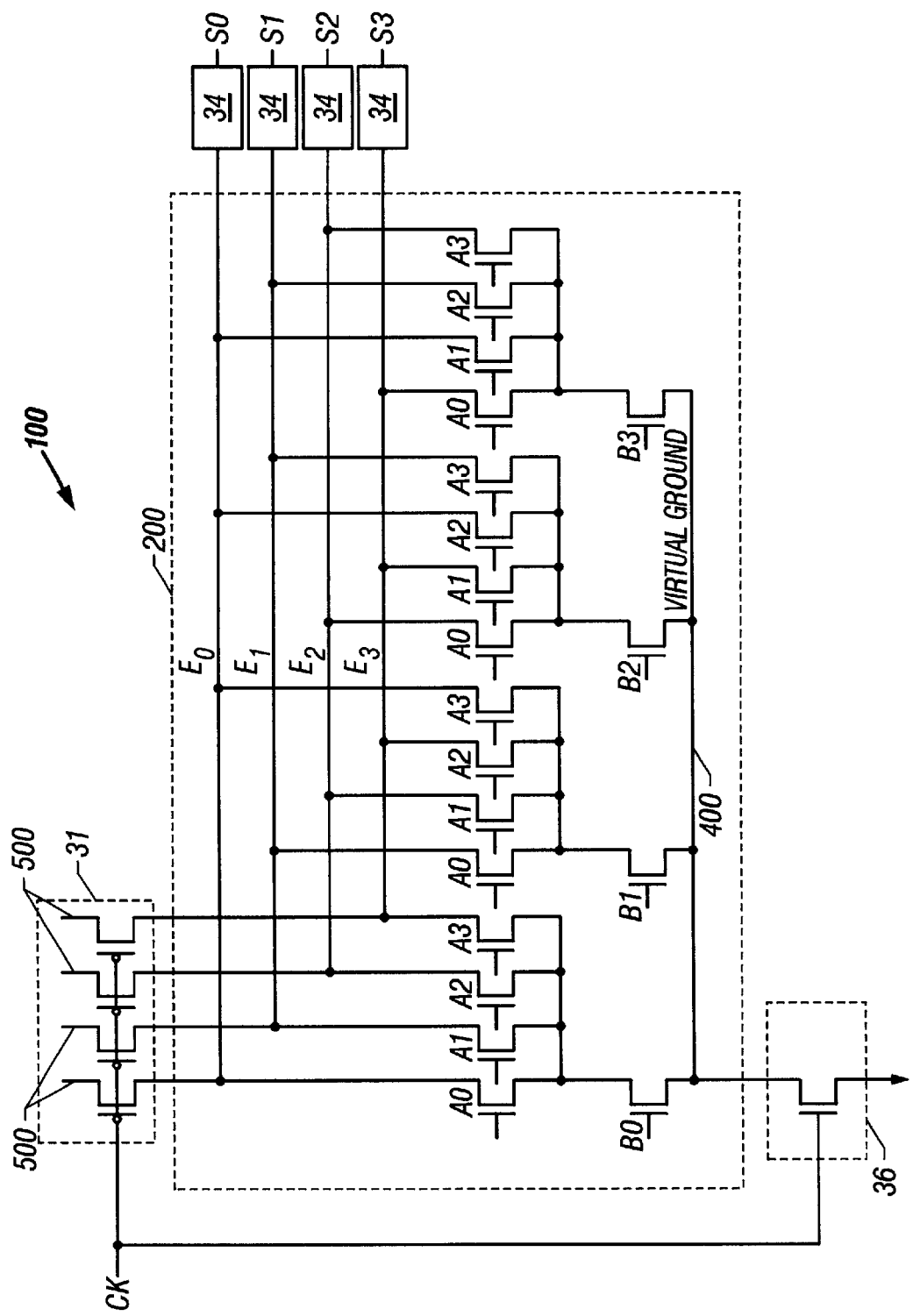
FIG. 2 is an illustration of an N-NARY adder gate.

Referring to FIG. 1, each N-NARY dit logic circuit 60 comprises a logic tree circuit 61, a precharge circuit 31, and an evaluate circuit 36. The logic tree circuit 61 performs a logic function on the two 1-of-4 input signals that could comprise a variety of functions, for example, the Boolean logic functions AND/NAND and OR/NOR, or the more complex carry-lookahead function of the present invention. The logic gates of the N-NARY family are clocked precharge (CP) gates. FIG. 2 illustrates that each input into the logic tree circuit 200 is coupled to at least one single N-channel field effect transistor (NFET) $A_0$–$A_3$, $B_0$–$B_3$. Referring back to FIG. 1, the logic tree circuit 200 therefore comprises one or more N-channel FETS. Coupled to the wires of the 1-of-4 output signal are the output buffers 34 that aid in driving additional circuits that couple to the output signal. The preferred embodiment of the present invention uses a circuit with an inverting function as the output buffer 34.

Referring again to FIG. 1, a precharge circuit 31 couples to the logic tree circuit 200 and precharges the dynamic logic of the logic tree circuit 200. The precharge circuit 31 comprises one or more FETs with the preferred embodiment of the circuit comprising P-channel FETs (PFETs). Each evaluation path of the logic tree circuit 200 has its own precharge PFET, shown as 500 in FIG. 2. The PFETs 500 of the precharge circuit 31 quickly and fully precharge all of the dynamic logic in the logic tree circuit 200 during the precharge phase of the clock cycle.

FIG. 2 is a diagram of an N-NARY adder gate. FIG. 2 illustrates that the precharge PFET 500 for an evaluation node E of an N-NARY circuit is connected to positive high voltage, Vcc, and is used to create conductive paths between the evaluation node E and Vcc. Each precharge PFET 500 is coupled to an input, the pre-charge signal. When the precharge signal for any evaluate node has a low voltage, then there is a conductive path between Vcc and the evaluation node E. Coupled to the precharge circuit 31 is the clock signal CK. A low clock signal on CK will cause the FETs in the logic tree circuit 32 to charge when using P-channel FETs in the precharge circuit 31.

An evaluate circuit 36 couples to the logic tree circuit 200 and controls the evaluation of the logic tree circuit 200. The evaluate circuit 36 comprises one or more FETs connected to the CK signal, with the preferred embodiment of the evaluate circuit comprising a single N-channel FET. The single N-FET acts as an evaluation transistor that is used to control when the gate is sensitive to inputs, and helps avoid races between other devices and excessive power consumption. During the precharge phase, the evaluate circuit 36 receives a low value so that no path to Vss may exist through the NFET(s) of the logic tree circuit 200. During the evaluate phase, the evaluate circuit 36 receives a high signal so that a path to Vss through the NFET(s) of the logic tree circuit 200 may exist. Coupled to the evaluate circuit 36 is the clock signal CK. A high clock signal on CK will cause the FETs in the logic tree circuit 200 to evaluate when using N-channel FETs in the evaluate circuit 36. In other words, when the clock signal is high, the evaluate circuit 36 evaluates the logic tree circuit 61.

Figure 3:
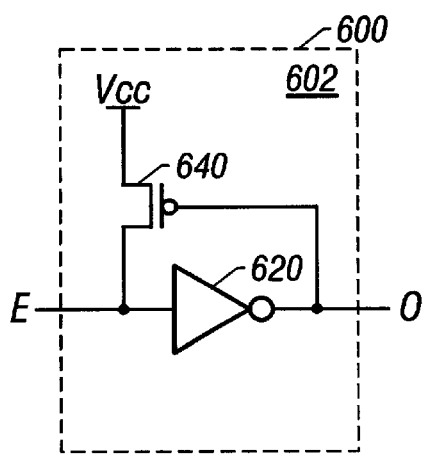
FIG. 3 is a diagram of a first embodiment of an N-NARY output driver circuit.
Figure 4:
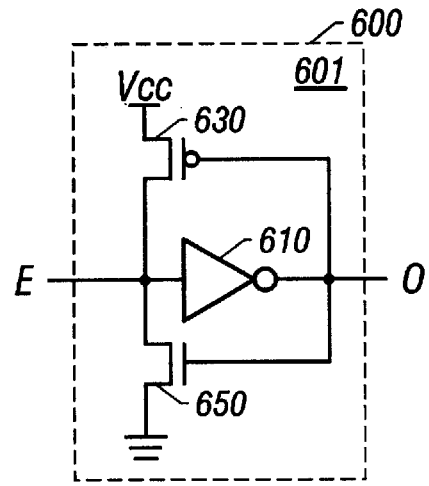
FIG. 4 is a diagram of a second embodiment of an N-NARY output driver circuit.

An evaluate node, E, which comprises the four wires $E_0$, $E_1$, $E_2$, and $E_3$, is the signal pathway between the logic tree circuit 200 and an output buffer 34, and constitutes an evaluation path of the logic tree circuit 200. As stated earlier, each evaluation node wire $E_0$, $E_1$, $E_2$, and $E_3$ has its own precharge PFET. The signal on a particular wire, $E_0$, $E_1$, $E_2$, $E_3$ of the evaluate node E is high, only when there is no connection to Vss through the logic tree circuit 200 NFET(s) associated with that particular wire. If the pre-charge signal is low at time 0, and there is no path to ground through the NFET(s) associated with an evaluate node E, of the logic tree circuit 200, then the evaluate node wire E gets pulled to a high voltage. This is called the precharge phase of the gate and we may also say that the gate is in precharge mode. If the precharge signal switches to a high voltage at a later time, the evaluate node E will be floating, but the charge left on it will leave the voltage high. This is called the evaluate phase of the gate, and we may also say that the gate is in evaluate mode. If input signals generate a high voltage for any NFET(s) in the logic tree circuit 200 such that a path from the evaluate node E to ground (Vss) exists, then the charge on the evaluate node E will drain to ground, and the evaluate voltage will drop to Vss. If no such path exists, then the evaluate node E will remain at Vcc. When any gate, therefore, switches from precharge mode to evaluate mode, the evaluate node voltage is high, and it either stays high or goes low. Once the evaluate node voltage goes low during the evaluate phase, it cannot be driven high again until the next precharge phase. Each evaluate node wire $E_0$, $E_1$, $E_2$, and $E_3$ couples to an output buffer 34. Two embodiments of the output driver circuit 600 comprising output buffer 34 are illustrated in FIGS. 3 and 4. FIG. 3 illustrates a half output driver circuit 602 that comprises an inverter 620 and a PFET device 640. FIG. 4 illustrates a full output driver circuit 601 that comprises an inverter 610 coupled to a PFET device 630 and an NFET device 650. Full keeper circuits 601 are only necessary for gates that can be in neither evaluate nor precharge mode. The flow through the output driver circuit 600 is from evaluate node E to the output signal path O. The inverter 610, 620 of the output driver circuit 600 is necessary because the CP gates of the N-NARY logic family precharge to a high value and evaluate to a low value. The output driver circuit 34, holds the value during an evaluate phase if the evaluate node E has not discharged. If the evaluate node E has discharged, then there is a path to ground holding its value low. The output of each evaluate node E will switch from high to low once, at most, during an evaluate phase. The output of each evaluate node E, once coupled to an output driver circuit 600 of output buffer 34, is therefore suitable for feeding a subsequent CP gate.

Figure 5:
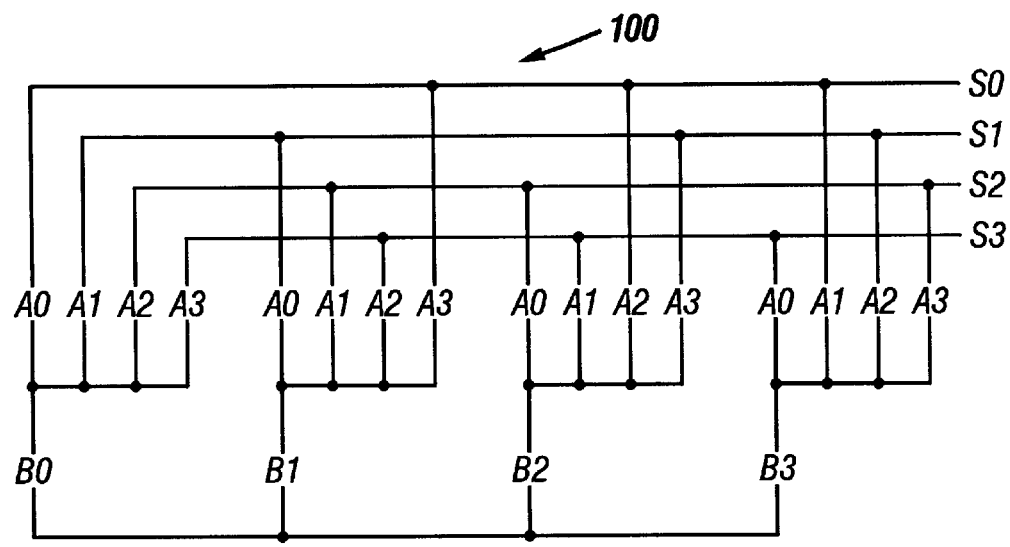
FIG. 5 is a shorthand representation of an N-NARY adder gate having two 1-of-4 inputs.
Figure 5A:
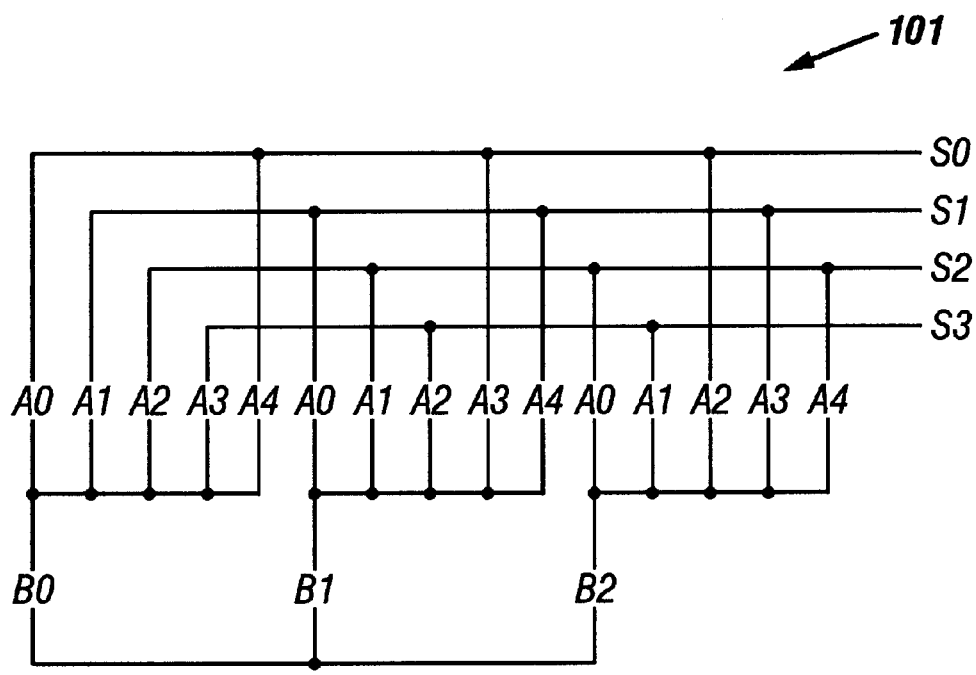
FIG. 5A is a shorthand representation of an N-NARY adder gate having one 1-of-3 input and one 1-of-5 input.

A shorthand notation for circuit diagrams can be adopted to avoid needless repetition of elements common to all N-NARY circuits. FIG. 2 illustrates these common elements. One common element is the pre-charge P-FET 500. Since all N-NARY gates require a pre-charge P-FET 500 for each evaluate node E, the pre-charge P-FETs 500 may be implied and need not be shown. The same is true for the N-FET associated with each input wire of the A and B inputs. Similarly, each evaluate node E must have its own output buffer 34, which may be implied. The N-FET associated with the evaluate node 36 may also be implied. Since these features are common to all N-NARY circuits, we may use the shorthand shown in FIG. 5 to represent the N-NARY circuits. Accordingly, FIG. 5 illustrates a shorthand notation of the adder gate depicted in FIG. 2. This shorthand notation is used in FIGS. 5, 5A, 7, 8–10, and 12–15. In each figure, the elements discussed herein should be implied accordingly.

Figure 6:
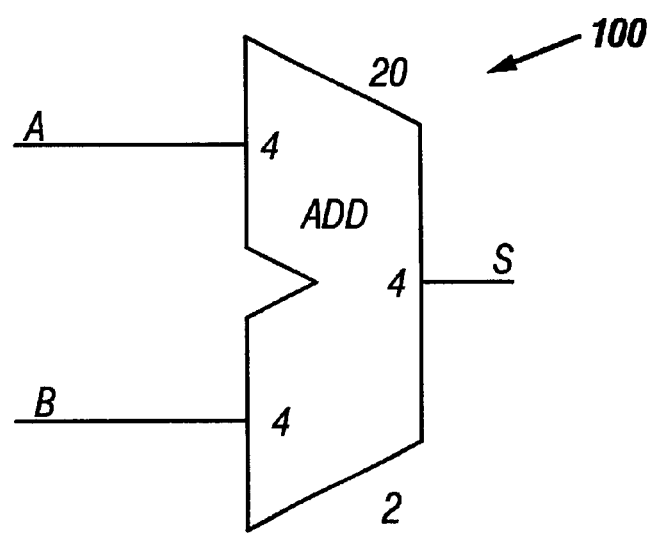
FIG. 6 is a high-level shorthand representation of an N-NARY adder gate.

A further simplification to the representation of the FIG. 2 adder is shown in FIG. 6, where the inputs and outputs are shown as single signals that each can represent one of four signals and each impliedly comprises four wires. The number "4" shown within the add gate of FIG. 6, adjacent to the connections, indicates that each signal can represent one of four values. The number above the gate indicates the number of transistors in the evaluate stack, and the number below the FIG. 6 gate represents the maximum number of transistors in series between the evaluate node and virtual ground. This high-level shorthand notation is used in FIGS. 6 and 9–15. In each figure, the elements discussed herein should be implied accordingly.

Carry Propagate Logic

Figure 11:
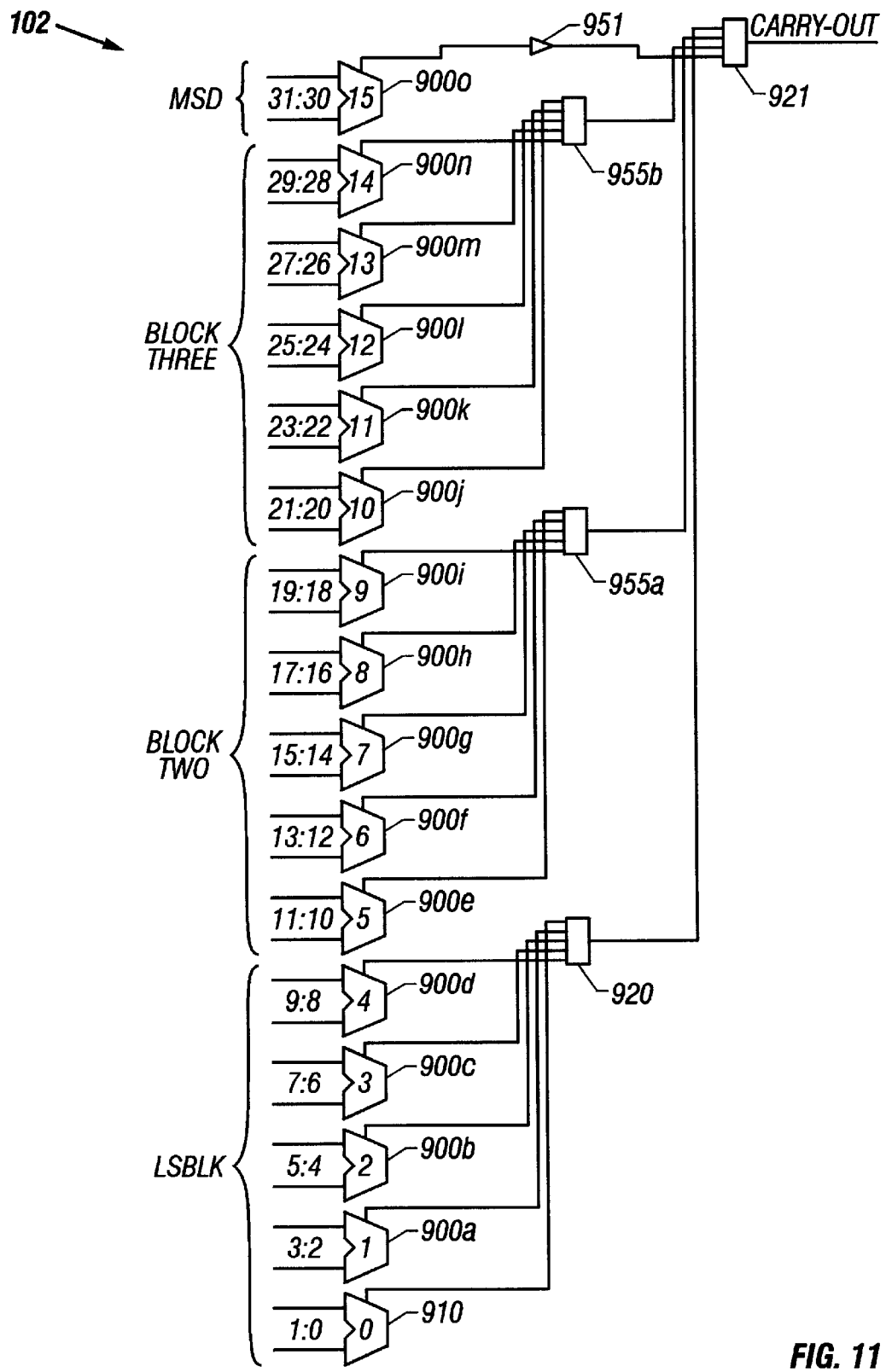
FIG. 11 is a high-level shorthand representation of an N-NARY magnitude comparator.
Figure 12:
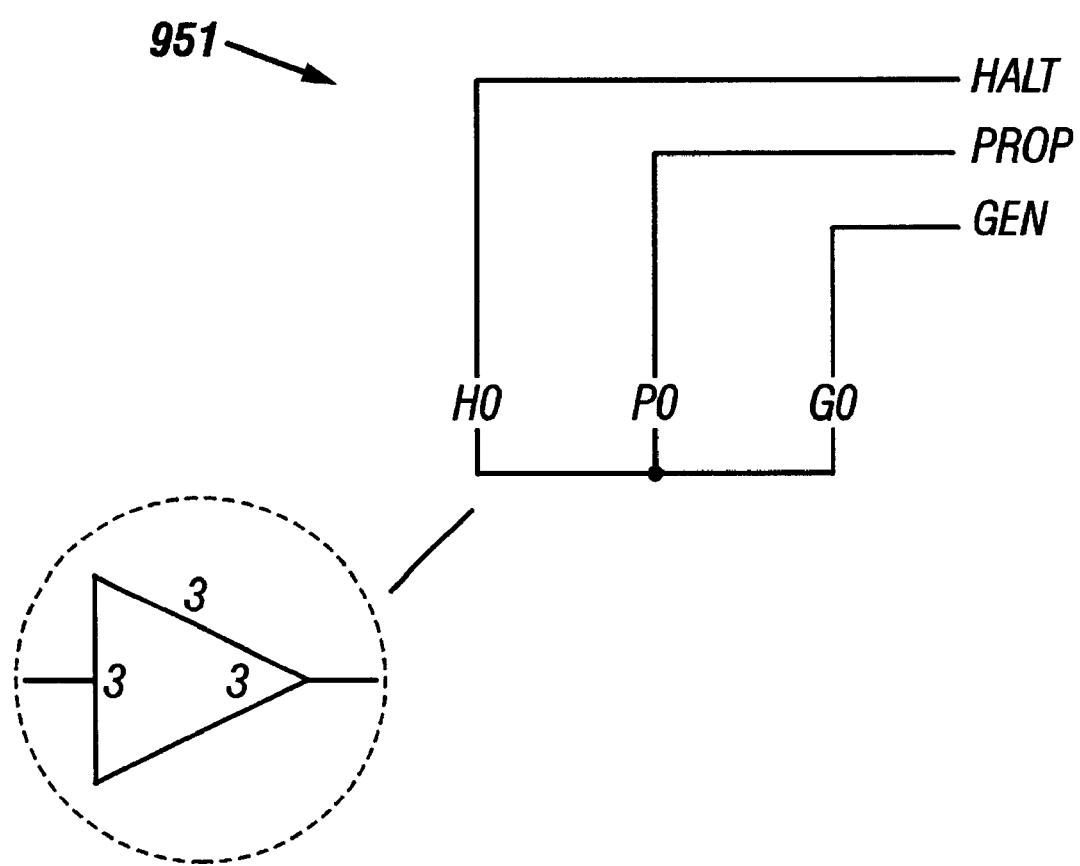
FIG. 12 is a shorthand representation of an N-NARY buffer.

FIG. 11 illustrates the preferred embodiment of the present invention, a three-logic-level N-NARY magnitude comparator 102. The magnitude comparator 102 takes two 32-bit 1-of-4 operands as inputs and produces as an output a 1-of-2 carry out indicator. A magnitude comparison is accomplished by subtracting the two operands to be compared and examining whether or not a carry is produced. When operand A is subtracted from operand B, the value of B is greater than or equal to the value of A if the subtraction operation generates a carry. If the subtraction does not generate a carry, then the value of B is less than the value of A.

FIG. 11 illustrates that magnitude comparison logic is essentially a subset of the logic required for a full adder/subtractor, such as the one set forth in the 3-stage Adder Application. FIG. 11 illustrates that the present invention 102 consists only of carry propagate logic, since sum/difference logic is unnecessary.

Generally, carry propagate logic takes carry conditions into account. For any two binary numbers A and B, the sum, $S_n$, and the carry, $C_n$, for a given bit position, n, are:

$$S_n = A_n \oplus B_n \oplus C_{n-1}, \text{ where } C_{n-1} \text{ is the carry in from the previous bit, } n-1. \quad (1)$$

$$C_n = A_n B_n | A_n C_{n-1} | B_n C_{n-1}, \text{ where } C_n \text{ is the carry out from bit } n. \quad (2)$$

The truth tables for Equation 1 and Equation 2 are set forth in Table 4.

TABLE 4

| $A_n$ | $B_n$ | $C_{n-1}$ | $A_n B_n$ (1) | $A_n C_{n-1}$ (2) | $B_n C_{n-1}$ (3) | $A_n \oplus B_n$ (4) | $S_n =$ (4) $\oplus C_{n-1}$ | $C_n =$ (1)\|(2)\|(3) |
|---|---|---|---|---|---|---|---|---|
| 0 | 0 | 0 | 0 | 0 | 0 | 0 | 0 | 0 |
| 0 | 0 | 1 | 0 | 0 | 0 | 0 | 1 | 0 |
| 0 | 1 | 0 | 0 | 0 | 0 | 1 | 1 | 0 |
| 0 | 1 | 1 | 0 | 0 | 1 | 1 | 0 | 1 |
| 1 | 0 | 0 | 0 | 0 | 0 | 1 | 1 | 0 |
| 1 | 0 | 1 | 0 | 1 | 0 | 1 | 0 | 1 |
| 1 | 1 | 0 | 1 | 0 | 0 | 0 | 0 | 1 |
| 1 | 1 | 1 | 1 | 1 | 1 | 0 | 1 | 1 |

In formulating carry propagate logic, one must recognize that the critical path in any adder or comparator is along the carry chain. The carry condition propagated into the most significant bit of the sum depends not only on the two most significant addend bits, but also the addend bits of every other bit position via the carry chain. Simply allowing carries to ripple from the least significant end would result in a compact but very slow adder or comparator, since the worst-case carry propagation delay would be approximately as many gate delays as the bit width of the adder or comparator.

Fast carry-propagate techniques can dramatically decrease the carry propagation delay, and therefore decrease the overall delay of the adder or comparator. Conventional carry propagate structures speed up the carry chain by computing the individual carry propagate (P) and carry generate (G) signals for each bit position. An example of an adder utilizing such carry-lookahead techniques is set forth in the 3-stage Adder Application.

For any two binary numbers A and B, the P and G signals for a given bit position, n, are:

$$P_n = A_n \oplus B_n \quad (3)$$

$$G_n = A_n B_n. \quad (4)$$

P and G may also be generated for 1-of-4 numbers. G indicates that the given dit position, n, generates a carry that must be accounted for in the higher dits of the sum. G will be set when the sum of two 1-of-4 numbers is greater than 3. P indicates that any carry generated in lower dits will propagate across the given dit position, n, to affect the higher dits of the sum. P will be set when the sum of two 1-of-4 numbers is exactly three. If neither G nor P is true for a given dit position, then a carry halt signal (H) is implied. An H signal indicates that any carry generated in lower dits will not propagate across the given bit position, n. H will be set if the sum of two 1-of-4 numbers is less than three. Restated, if the sum of two operand dits in a given dit position is greater than 3, G is true. If the sum is exactly 3, P is true. Otherwise, H is true.

Figure 7:
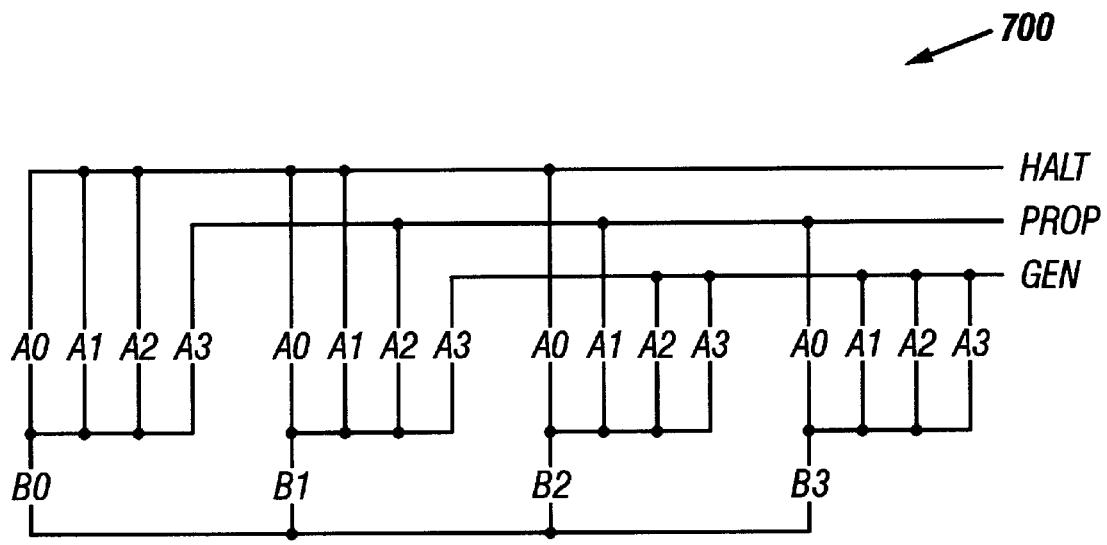
FIG. 7 is a shorthand representation of an N-NARY HPG gate having two 1-of-4 inputs.
Figure 8:
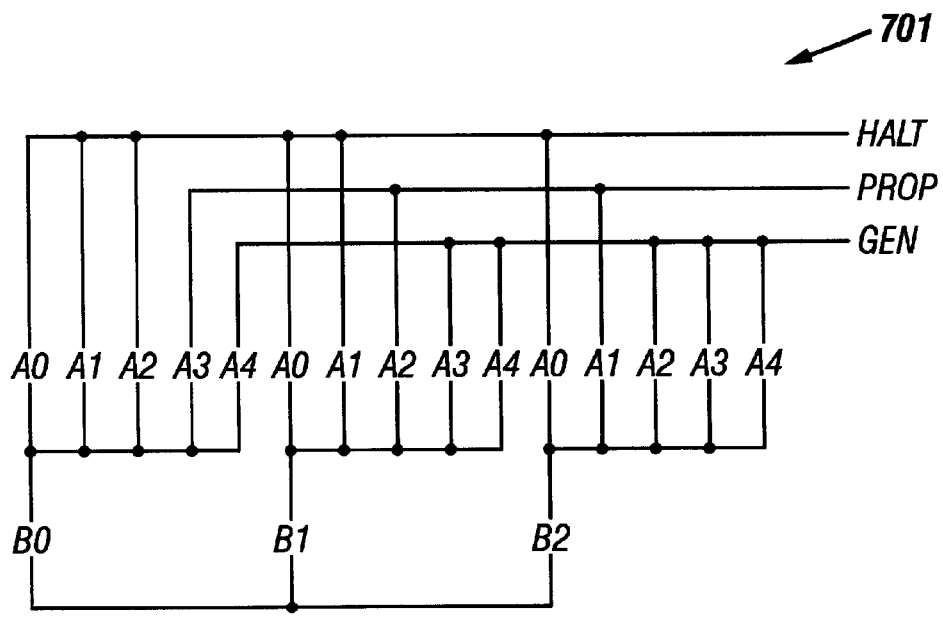
FIG. 8 is a shorthand representation of an N-NARY HPG gate having one 1-of-3 input and one 1-of-5 input.

FIG. 7 illustrates an N-NARY HPG gate 700 that utilizes carry propagate logic to generate an H, P, or G indication for two two-bit 1-of-4 addends. A similar function may be performed using one 1-of-3 addend and one 1-of-5 addend. Such a gate 701 is illustrated in FIG. 8. The output of the FIG. 7 gate 700 is a 1-of-3 N-NARY signal, such that one, and only one, of the H, P, or G wires is asserted during a given evaluate cycle. The output of the HPG gate 700 conforms to Table 5.

TABLE 5

| $A_3$ | $A_2$ | $A_1$ | $A_0$ | A Dec. Value | $B_3$ | $B_2$ | $B_1$ | $B_0$ | B Dec. Value | $P_n$ | $G_n$ | $H_n$ |
|---|---|---|---|---|---|---|---|---|---|---|---|---|
| 0 | 0 | 0 | 1 | 0 | 0 | 0 | 0 | 1 | 0 | 0 | 0 | 1 |
| 0 | 0 | 0 | 1 | 0 | 0 | 0 | 1 | 0 | 1 | 0 | 0 | 1 |
| 0 | 0 | 0 | 1 | 0 | 0 | 1 | 0 | 0 | 2 | 0 | 0 | 1 |
| 0 | 0 | 0 | 1 | 0 | 1 | 0 | 0 | 0 | 3 | 1 | 0 | 0 |
| 0 | 0 | 1 | 0 | 1 | 0 | 0 | 0 | 1 | 0 | 0 | 0 | 1 |
| 0 | 0 | 1 | 0 | 1 | 0 | 0 | 1 | 0 | 1 | 0 | 0 | 1 |
| 0 | 0 | 1 | 0 | 1 | 0 | 1 | 0 | 0 | 2 | 1 | 0 | 0 |
| 0 | 0 | 1 | 0 | 1 | 1 | 0 | 0 | 0 | 3 | 0 | 1 | 0 |
| 0 | 1 | 0 | 0 | 2 | 0 | 0 | 0 | 1 | 0 | 0 | 0 | 1 |
| 0 | 1 | 0 | 0 | 2 | 0 | 0 | 1 | 0 | 1 | 1 | 0 | 0 |
| 0 | 1 | 0 | 0 | 2 | 0 | 1 | 0 | 0 | 2 | 0 | 1 | 0 |
| 0 | 1 | 0 | 0 | 2 | 1 | 0 | 0 | 0 | 3 | 0 | 1 | 0 |
| 1 | 0 | 0 | 0 | 3 | 0 | 0 | 0 | 1 | 0 | 1 | 0 | 0 |
| 1 | 0 | 0 | 0 | 3 | 0 | 0 | 1 | 0 | 1 | 0 | 1 | 0 |
| 1 | 0 | 0 | 0 | 3 | 0 | 1 | 0 | 0 | 2 | 0 | 1 | 0 |
| 1 | 0 | 0 | 0 | 3 | 1 | 0 | 0 | 0 | 3 | 0 | 1 | 0 |

Referring back to Equ. 1, above, the Carry into a bit, $C_{n-1}$, is calculated as: $C_{n-1} = G(n-1) + P(n-1)G(n-2) + P(n-1)P(n-2)G(n-3) + \ldots + P(n-1)P(n-2) \ldots P(1)G(0)$. To reduce the complexity of the carry computation, the scope of the computation is often constrained to a block of a fixed number of bits. In such a case, block-level propagates and generates are computed recursively.

Preferred Embodiment of the Present Invention.

The preferred embodiment of the present invention utilizes a subtraction-based implementation of the H, P, and G carry propagate indicators discussed above. FIG. 11 illustrates that the magnitude comparator 102 of the present invention is constructed in three Logic Levels comprising a Subtraction Logic, a Block HPG Logic, and a Comparison Logic. Since the carry chain is the critical path of an adder or subtractor, as discussed in the 3-stage Adder Application, removing the sum logic from that required for a full adder does not reduce the number of logic levels required in the magnitude comparator 102. That is, both the full adder disclosed in the 3-stage Adder Application and the magnitude comparator 102 disclosed herein require three levels of logic. However, because the magnitude comparator 102 is a dedicated subtractor, the first-level logic gates for a magnitude comparator 102 are simpler than those of a full adder, since addition need not be supported in such gates. FIG. 11 illustrates that the Subtraction Logic of the present invention 102 comprises two types of subtraction gates, a least significant dit ("LSD") subtraction gate 910 and a standard subtraction gate 900. The LSD subtraction gate 910 implements four's complement addition while the standard subtraction gate 900 implements three's complement addition. The operation of both gates 910, 900 is described in further detail below.

Each of the magnitude comparator's 102 Logic Levels conceptually may be further grouped into "blocks." Blocks represent: a) certain corresponding dits of the two 32-bit 1-of-4 operands, and b) the logic gates of each Logic Level associated with such dits. The least significant block, LSBlk, represents the five least significant dits of each operand, dits 0 through 4 (comprising bits 0 through 9), along with the Subtraction Logic, Block HPG Logic, and Comparison Logic gates associates with said dits. Similarly, Block Two represents dits 5 through 9 (bits 10 through 19) of the operand and also represents the Subtraction Logic, Block HPG Logic, and Comparison Logic gates associated with dits 5 through 9. By the same token, Block Three represents dits 10 through 14 (bits 20 through 29) and associated gates. The MSD is a one-dit block representing the most significant dit, Dit 15, and the Subtraction Logic, Block HPG Logic, and Comparison Logic gates associated with Dit 15 (bits 30 and 31).

FIG. 11 illustrates that the second Logic Level, the Block HPG Logic, comprises three block HPG gates 920, 955a, 955b, one each for LSBlk, Block Two, and Block Three. Each of the block HPG gates 920, 955a, 955b receives five HPG signals as inputs. Each block HPG gate 920, 955 then determines whether a carry is generated by the dit-wise subtraction of B−A within its five-dit block and so indicates with a block HPG output indicator. The block HPG gate 920 for the LSBlk receives from gate 910 a 1-of-2 HPG signal that reflects a condensed halt/propagate signal since there will never be a carry into the LSD. Gate 955, in contrast, receives five 1-of-3 HPG indicators as inputs. The block HPG indicator from each block HPG gate 920, 955a, 955b is passed to the Comparison Logic. FIG. 11 illustrates that the HPG indicator for the MSD is passed from the MSD Subtraction Logic gate 900o, rather than being processed by a block HPG gate, to a buffer 951 that stores the value of the HPG indicator of the MSD for later use by the Comparison Logic. The operation of the block HPG gates 920, 955 and the buffer 951 is discussed in further detail below.

The third Logic Level, the Comparison Logic, comprises one comparison gate 921. The comparison gate 921 receives as inputs the block HPG output indicator from each of the block HPG gates 920,955a, 955b as well as the MSD HPG indicator stored in Buffer 951. The comparison gate 921 indicates with a 1-of-2 output whether the full-operand subtraction operation of B−A has generated a carry. As with the gates of the other two Logic Levels, the operation of the comparison gate 921 is discussed in further detail below.

First Level Subtraction/HPG Gates—not LSB

Figure 9:
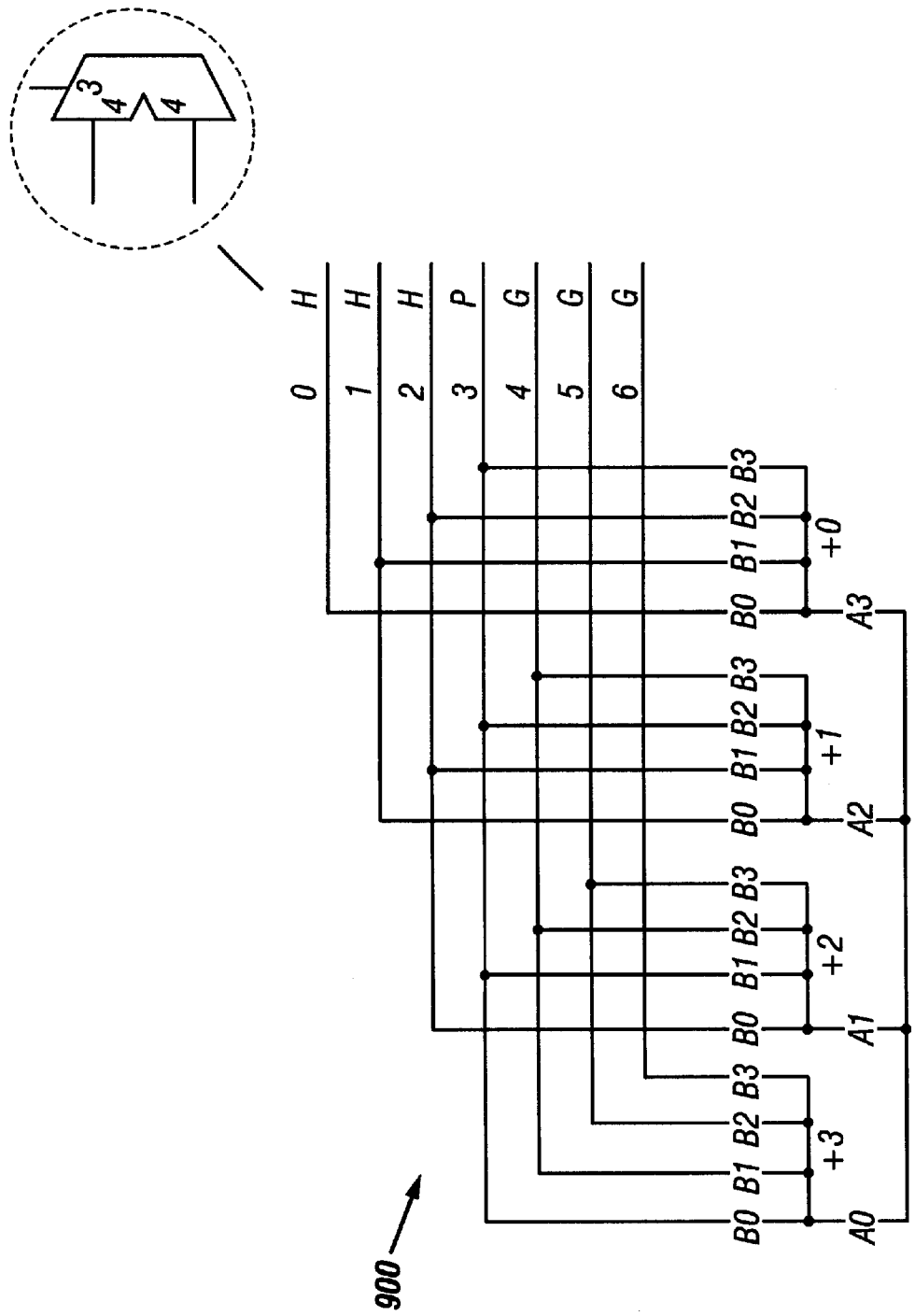
FIG. 9 is a shorthand representation of an N-NARY subtraction/HPG gate having two 1-of-4 inputs.
Figure 10:
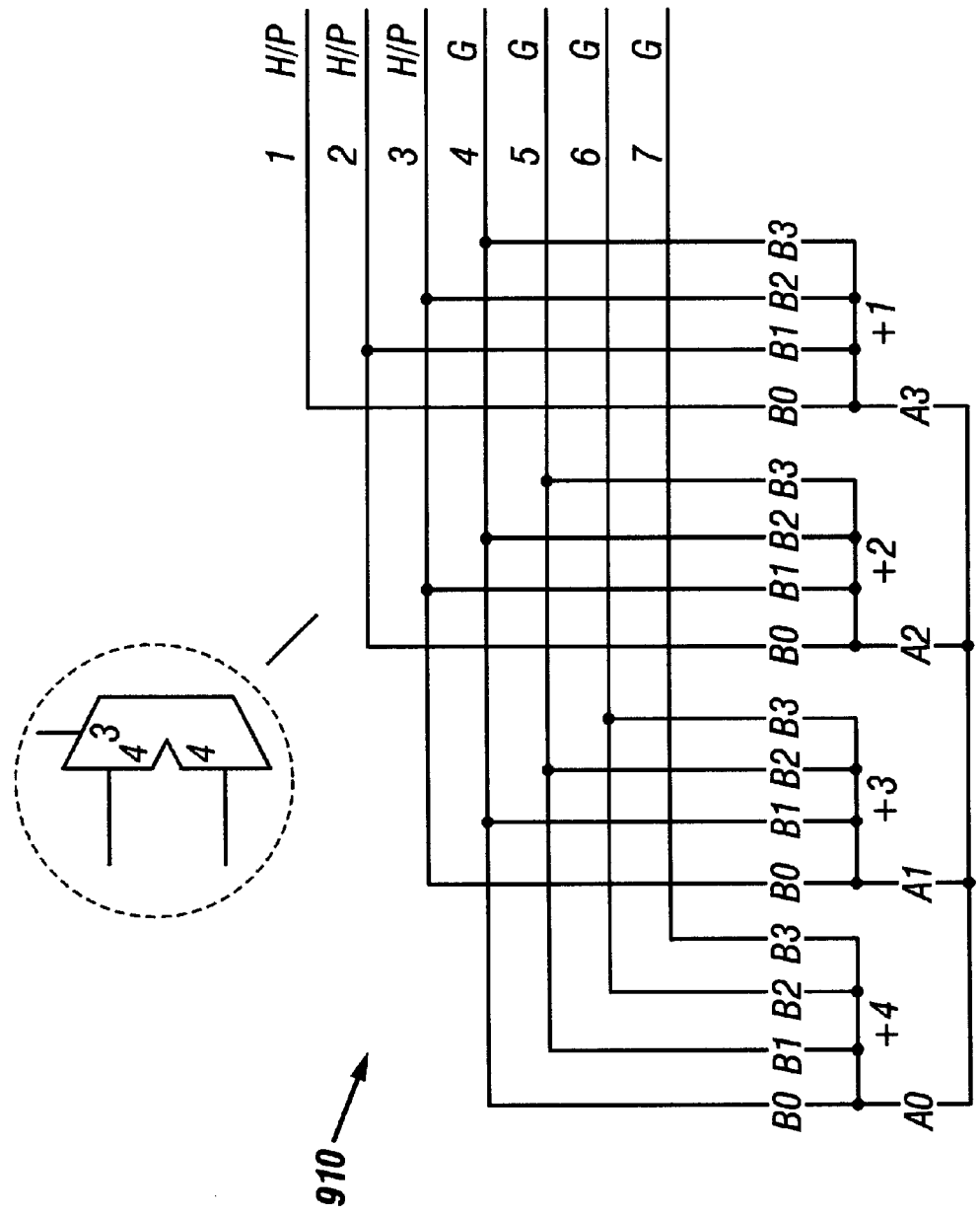
FIG. 10 is a shorthand representation of an N-NARY LSB subtraction/HPG gate having two 1-of-4 inputs.

The logic gates 900, 910 of the first Logic Level combine the HPG functions described above with subtraction logic, which is discussed below. FIG. 9 illustrates the standard subtraction/HPG gate 900 used in the first Logic Level. FIG. 10 illustrates the LSD subtraction HPG gate 910 used in the first Logic Level. These gates 900, 910 produce only an HPG output, since sum logic is unnecessary in a comparator.

The standard subtraction/HPG gate 900 of the first Logic Level is illustrated in FIG. 9. FIG. 9 illustrates that the standard subtraction/HPG gate 900 takes as inputs one dit each of the two 1-of-4 operands, A and B. FIG. 9 further illustrates that Gate 900 produces as its output a 1-of-3 HPG indicator that reflects the carry/borrow status of the subtraction operation on the two operand dits.

Gate 900 performs three's complement subtraction. In general, subtraction of a base four number is obtained by adding the three's complement of the subtrahend plus one. The least significant dit position absorbs the added one, and all other dit positions reflect only the three's complement. FIG. 9 illustrates that Gate 900 complements the minuend. That is, Gate 900 implements subtraction by adding the three's complement of the A operand to the B operand. In order to clarify this processing a discussion of subtraction logic is set forth below.

The subtraction/HPG gates of the first Logic Level 900, 910, subtract the value of the A operand from the B operand. A truth table demonstrating the subtraction operation, B−A, using 1-of-4 encoding is set forth in Table 7. Each of the two-bit 1-of-4 inputs, A and B, in Table 7 can represent one of four values, 0 through 3 inclusive, depending on which of the four wires for each signal is asserted. The four wires for the two-bit 1-of-4 difference of the subtraction operation in Table 7 are labeled $D_3$, $D_2$, $D_1$, and $D_0$.

TABLE 7

| 0 | $B_2$ | $B_1$ | $B_0$ | B Dec. Value | $A_3$ | $A_2$ | $A_1$ | $A_0$ | A Dec. Value | $D_3$ | $D_2$ | $D_1$ | $D_0$ | B − A Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | −1 |
| 0 | 0 | 0 | 1 | 0 | 0 | 1 | 0 | 0 | 2 | 0 | 1 | 0 | 0 | −2 |
| 0 | 0 | 0 | 1 | 0 | 1 | 0 | 0 | 0 | 3 | 1 | 0 | 0 | 0 | −3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 0 | 0 | 1 | 0 |
| 0 | 0 | 1 | 0 | 1 | 0 | 1 | 0 | 0 | 2 | 1 | 0 | 0 | 0 | −1 |
| 0 | 0 | 1 | 0 | 1 | 1 | 0 | 0 | 0 | 3 | 0 | 1 | 0 | 0 | −2 |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 1 |
| 0 | 1 | 0 | 0 | 2 | 0 | 1 | 0 | 0 | 2 | 0 | 0 | 0 | 1 | 0 |

TABLE 7-continued

| 0 | $B_2$ | $B_1$ | $B_0$ | B Dec. Value | $A_3$ | $A_2$ | $A_1$ | $A_0$ | A Dec. Value | $D_3$ | $D_2$ | $D_1$ | $D_0$ | B − A Decimal Value |
|---|---|---|---|---|---|---|---|---|---|---|---|---|---|---|
| 0 | 1 | 0 | 0 | 2 | 1 | 0 | 0 | 0 | 3 | 0 | 0 | 1 | 0 | −1 |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 1 | 0 | 0 | 2 |
| 1 | 0 | 0 | 0 | 3 | 0 | 1 | 0 | 0 | 2 | 0 | 0 | 1 | 0 | 1 |
| 1 | 0 | 0 | 0 | 3 | 1 | 0 | 0 | 0 | 3 | 0 | 0 | 0 | 1 | 0 |

In Table 7, negative output values in the "B−A" column indicate that a borrow from the next higher-order dit must occur. In performing subtract logic within a processor, it is useful to implement subtraction as a form of complement addition. An adder may be made to subtract by forming the radix complement of the subtrahend and adding it to the minuend, where "radix" refers to the base of the number system being used. The radix complement of a number is formed by adding one to the least significant bit of the diminished radix complement of the number. The diminished radix complement is formed by subtracting every digit of the subtrahend from a number y, where y=base−1. In binary systems, subtraction is often implemented using the radix complement, or two's complement. Two's complement is formed by incrementing a one's complement number (the diminished radix complement). One's complement is formed by subtracting each bit of the subtrahend from 1, which is one less than the base (2). Formation of the 1's complement effects an inversion of each digit of the subtrahend.

The preferred embodiment of the Subtraction Logic gates 900, 910 because they operate on 1-of-4 inputs, are not binary. Instead, the system of the present invention is quaternary, with a base of four. Accordingly, the subtraction of the present invention is implemented as a form of four's complement addition. In the present invention, therefore, the subtrahend is converted to three's complement, the diminished radix complement, by novel circuitry that emulates the effect of subtracting each dit of the subtrahend from three. (As is discussed below, the LSD subtraction/HPG gate 910 converts the subtrahend from three's complement to four's complement, the radix complement, by novel circuitry that emulates the effect of incrementing the least significant dit of the three's complement number.) Table 8 illustrates the three's complement for each of the four possible values of a 1-of-4 dit.

TABLE 8

| x (decimal) | x (1-of-4) | 3's Comp. (3 − x) | 3 − x (1-of-4) |
|---|---|---|---|
| 0 | 0001 | 3 | 1000 |
| 1 | 0010 | 2 | 0100 |
| 2 | 0100 | 1 | 0010 |
| 3 | 1000 | 0 | 0001 |

Since four's complement is generated by adding one to the least significant dit of a three's complement number, the present invention provides subtraction capability by providing a path that converts each dit, except the LSD, of the subtrahend to the three's complement. The present invention converts the LSD of the subtrahend to a four's complement representation.

Table 9 sets forth the subtraction truth table for the subtraction of two 1-of-4 numbers, A and B, by adding the three's complement of A to B in order derive the two-bit difference of B−A. In Table 9, A and B are represented in both decimal and 1-of-4 representations. The "~A" column of Table 9 represents the three's complement value of the subtrahend, A. The "~A (1-of-4)" column represents the three's complement of A in 1-of-4 representation. The "Pre-corr. Diff." column represents the difference of B−A, represented in a pre-correction format discussed in detail below. The "Diff." column represents the difference in post-correction decimal format. While the following discussion of the "Diff." column and the pre-correction format are necessary to an understanding of the operation of gate 900, it should be noted that gate 900 does not produce an output reflecting the difference of B−A, but rather produces an HPG output that is based on the difference.

TABLE 9

| B | B (1-of-4) | A | A (1-of-4) | ~A | ~A (1-of-4) | Pre-Corr. Diff (B − A) | Diff |
|---|---|---|---|---|---|---|---|
| 0 | 0001 | 0 | 0001 | 3 | 1000 | 3 | 0 |
| 1 | 0010 | 0 | 0001 | 3 | 1000 | 0* | 1 |
| 2 | 0100 | 0 | 0001 | 3 | 1000 | 1* | 2 |
| 3 | 1000 | 0 | 0001 | 3 | 1000 | 2* | 3 |
| 0 | 0001 | 1 | 0010 | 2 | 0100 | 2 | −1 |
| 1 | 0010 | 1 | 0010 | 2 | 0100 | 3 | 0 |
| 2 | 0100 | 1 | 0010 | 2 | 0100 | 0* | 1 |
| 3 | 1000 | 1 | 0010 | 2 | 0100 | 1* | 2 |
| 0 | 0001 | 2 | 0100 | 1 | 0010 | 1 | −2 |
| 1 | 0010 | 2 | 0100 | 1 | 0010 | 2 | −1 |
| 2 | 0100 | 2 | 0100 | 1 | 0010 | 3 | 0 |
| 3 | 1000 | 2 | 0100 | 1 | 0010 | 0* | 1 |
| 0 | 0001 | 3 | 1000 | 0 | 0001 | 0 | −3 |
| 1 | 0010 | 3 | 1000 | 0 | 0001 | 1 | −2 |
| 2 | 0100 | 3 | 1000 | 0 | 0001 | 2 | −1 |
| 3 | 1000 | 3 | 1000 | 0 | 0001 | 3 | 0 |

The values in the "Pre-Corr. Diff" column of Table 9 denoted by asterisks are mod 4 values of a difference that is too large to be represented in two bits. Conceptually, these cases generate a carry into the next higher-order dit, where such carry represents a value of four.

The standard subtraction/HPG gate 900 illustrated in FIG. 9 performs three's complement subtraction in the following manner. FIG. 9 illustrates that each set, or "node" of B inputs in gate 900 has been labeled with the conceptual value of the A input. The left-most node of B inputs in FIG. 9, labeled "+3." This labeling indicates that, when the value of a dit of the A operand equals zero, the three's complement of zero, which is three, will be added to the value of the corresponding B operand dit. From left to right, the remaining B nodes have been labeled as the "+2", "+1", and "0" nodes, respectively. As explained above, the $A_0$ input is coupled to the "+3" node because the three's complement of zero is three. The addition of three to the B input when the value of $A_n$ is zero effectuates the conversion of A to a three's complement value before it is added to B. Similarly, the $A_1$ input is coupled to the "+2" node because the three's complement of one is two. Likewise, the $A_2$ input is coupled to the "+1"

node and the $A_3$ input is coupled to the "+0" node. Through this novel circuitry approach, Gate 900 simply and elegantly converts A to its three's complement representation.

Pre-correction Format for Three's Complement Subtraction

The values set forth in the "Pre-Corr. Diff" column of Table 9 represent the present invention's pre-correction format for three's complement subtraction. Rather than producing an intermediate difference (hereinafter referred to as "Diff") value that represents B–A for a given bit n, the format of the pre-corrected Diff in Table 9 is: $(b-1)+B_n-A_n$, where b is the base. In the preferred embodiment of the present invention, the base is four. Such format is based on the following two assumptions.

| Assumptions: |
|---|
| I) a borrow from dit x by the dit of next-lowest significance is implied for each dit except the least significant dit of the intermediate difference; and |
| II) every dit x will require a borrow from the dit of next-higher significance. |

Considering the first assumption in isolation, the borrow results in 1 being subtracted ("borrowed") from dit n. This first borrow conceptually adds the base to dit n–1. The first assumption therefore results in subtraction of 1 from the intermediate difference for dit n, providing a pre-correction format of $(-1)+(B_n-A_n)$. The latter assumption results in the base, b, being subtracted ("borrowed") from dit n+1 and added to dit n. Combining the second assumption with the first, the pre-correction format of the present invention therefore becomes $(b-1)+(B_n-A_n)$.

Least Significant Dit—Subtraction using Four's Complement.

Table 9(b) sets forth the subtraction truth table for the four's complement subtraction of two 1-of-4 numbers, A and B, by adding the four's complement of A to B in order derive the two-bit difference of B–A. This processing is performed by gate 910 on Dit 0 of the A and B operand. In Table 9(b), A and B are represented in both decimal and 1-of-4 representations. The "~A" column of Table 9(b) represents the three's complement value of the subtrahend, A, and the "~A+1" column represents the four's complement value of A. The "~A+1 (1-of-4)" column represents the four's complement of A in 1-of-4 representation. The "Pre-corr. Diff." column represents the difference of B–A, represented in a pre-correction format discussed in detail below. The "Diff." column represents the difference in post-correction decimal format.

TABLE 9(b)

| B | B (1-of-4) | A | A (1-of-4) | ~A | ~A + 1 | ~A + 1 (1-of-4) | Pre-Corr. Diff (B − A) | Diff (B − A) |
|---|---|---|---|---|---|---|---|---|
| 0 | 0001 | 0 | 0001 | 3 | 4 | 0001* | 0* | 0 |
| 1 | 0010 | 0 | 0001 | 3 | 4 | 0001* | 1* | 1 |
| 2 | 0100 | 0 | 0001 | 3 | 4 | 0001* | 2* | 2 |
| 3 | 1000 | 0 | 0001 | 3 | 4 | 0001* | 3* | 3 |
| 0 | 0001 | 1 | 0010 | 2 | 3 | 1000 | 3 | −1 |
| 1 | 0010 | 1 | 0010 | 2 | 3 | 1000 | 0* | 0 |
| 2 | 0100 | 1 | 0010 | 2 | 3 | 1000 | 1* | 1 |
| 3 | 1000 | 1 | 0010 | 2 | 3 | 1000 | 2* | 2 |
| 0 | 0001 | 2 | 0100 | 1 | 2 | 0100 | 2 | −2 |
| 1 | 0010 | 2 | 0100 | 1 | 2 | 0100 | 3 | −1 |
| 2 | 0100 | 2 | 0100 | 1 | 2 | 0100 | 0* | 0 |
| 3 | 1000 | 2 | 0100 | 1 | 2 | 0100 | 1* | 1 |
| 0 | 0001 | 3 | 1000 | 0 | 1 | 0010 | 1 | −3 |

TABLE 9(b)-continued

| B | B (1-of-4) | A | A (1-of-4) | ~A | ~A + 1 | ~A + 1 (1-of-4) | Pre-Corr. Diff (B − A) | Diff (B − A) |
|---|---|---|---|---|---|---|---|---|
| 1 | 0010 | 3 | 1000 | 0 | 1 | 0010 | 2 | −2 |
| 2 | 0100 | 3 | 1000 | 0 | 1 | 0010 | 3 | −1 |
| 3 | 1000 | 3 | 1000 | 0 | 1 | 0010 | 0* | 0 |

The values in the "Pre-Corr. Diff" and "~A+1 (1-of-4)" columns denoted by asterisks are mod 4 values of a difference that is too large to be represented in two bits. Conceptually, these cases generate a carry into the next higher-order dit, where such carry represents a value of four.

FIG. 10 illustrates the LSD subtraction/HPG gate 910. FIG. 10 illustrates that the LSD subtraction/HPG gate 910 takes as inputs the 1-of-4 LSD's of the A and B operands. The LSD subtraction/HPG gate 910 produces as its output a 1-of-3 HPG indicator. FIG. 10 illustrates that the LSD Level One gate 910 performs only four's complement subtraction and not three's complement subtraction. The LSD subtraction/HPG gate 910 therefore addresses the need to increment the three's complement of the minuend in order to form the four's complement in the LSD for a subtraction operation. That is, Gate 910 not only complements the A operand, but it then increments the complemented A operand in order to form the four's complement. Accordingly, a comparison of FIGS. 9 and 10 indicates that Gate 910 has an additional evaluate node, S7, which pulls the GEN output high.

Gate 910 performs four's complement subtraction in the following manner. Each node of B inputs in FIG. 10 has been labeled with the conceptual value of the A input associated with that node. The leftmost node of B inputs in FIG. 10 has been labeled as the "+4" node. From left to right, the remaining nodes have been labeled as the "+3", "+2", and "+1", nodes, respectively. As stated, the $A_0$ input is coupled to the "+4" block. Because the four's complement of zero is four (i.e., 3−0=3; 3+1=4), the addition of four to the B input when the value of $A_n$ is zero effectuates the conversion of A to a four's complement value before it is added to B. It is therefore apparent that the novel four's complement subtraction gate 910 depicted in FIG. 10 properly performs four's complement subtraction in the LSD.

As an additional modification of the LSD gate 910 over the standard subtraction/HG gate 900, FIG. 10 shows that the HALT and PROP indicators are combined in Gate 910, since there will never be a borrow propagated into the LSD. Accordingly, FIG. 11 indicates that a HALT/PROP indicator is produced as an output of the LSD subtraction/HPG gate 910 that comprises a NAND of the first, second, and third evaluate nodes. These nodes correspond to any combination of A and B inputs that do not generate a carry for the operation B–A.

Pre-correction Format for Four's Complement Subtraction

The values set forth in the "Pre. Corr. Diff" column of Table 9(b) represent the present invention's pre-correction format for four's complement subtraction. Rather than three's complement subtraction, gate 910 performs four's complement subtraction to implement the least significant dit (LSD) of the subtraction operation. Since there will never be a borrow out of the LSD by a less significant dit, gate 910 only implements Assumption II listed above, and not Assumption I. Assumption II results in the base, b, being subtracted ("borrowed") from dit n+1 and added to dit n. The pre-correction format for the intermediate difference for gate 910, represented in the "Pre-Corr. Diff" column of Table 9(b), is therefore $b+B_n-A_n$, where b is the base, which is 4.

Level One Borrow Propagate Logic

The Level One gates 900, 910 generate a (H)alt-(P)ropagate-G(enerate) signal for each dit based on the difference of B−A in the pre-correction formats discussed above. In order to understand the present invention's operation regarding the setting of the H, P, and G signals for subtraction, it is useful to keep in mind the various conceptual transfers of data that may occur during a subtract operation. Example 1 sets forth these conceptual transfers among three dits in a subtract operation, the LSD, dit n, and dit n+1.

EXAMPLE 1

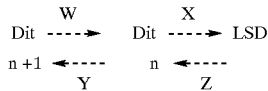

In Example 1, W represents a borrow from Dit n+1 into Dit n. Such borrow will conceptually subtract one from the value of Dit n+1 and will conceptually add a value equal to the base (in this case, four) to the value of Dit n. The borrow depicted by W in Example 1 illustrates the application of Assumption I discussed above to Dit n+1. Likewise, data transfer W also illustrates the application of Assumption II to Dit n. Similarly, X represents a borrow from Dit n into the LSD. Data transfer X therefore represents the application of Assumption I to Dit n and the application of Assumption II to the LSD.

Still referring to Example 1, data transfer Y represents a carry from Dit n into Dit n+1. Such carry will decrement the base (four) from the value of Dit n and will add one to Dit n+1. The carry represented in Y will occur whenever the intermediate difference for Dit n is too large to be represented with two bits. Similarly, Z represents a carry from the LSD into Dit n.

Example 1 also illustrates that there will never be a borrow out of the LSD because there is no dit to the right of the LSD. This is the reason that the four's-complement Level One gate 910 illustrated in FIG. 10 and the four's complement subtraction circuits of gates 920, 930, and 940 apply only Assumption II, and not Assumption I, to generate the four's complement pre-correction format.

Keeping the foregoing assumptions and data transfers in mind, we now turn to the present invention's setting of the H, P, and G indicators for subtract operations. In the subtraction operation of the present invention, an H signal relates to the concept of "borrowing." A borrow is the complement of a generate associated with addition. Conceptually, the action of a borrow from dit n is to decrement the value of the difference for dit n in the final level of logic in a subtractor, after all borrows have been propagated—just as a G signal that propagates to a given dit position in addition will increment the value of the sum for dit n.

Regarding the H signal, it is important to note that, as stated in Assumption II above, the present invention assumes that the intermediate difference generated for any dit n will be incremented via a borrow. In other words, there is an implied assumption that there will be a borrow by dit n from the dit of next-higher significance (n+1). Assumption II therefore assumes that the data transfer denoted by W in Example 1 will always occur. Accordingly, the intermediate difference for dit n created by the present invention contains an "implied borrow." The H(alt) signal associated with the subtraction operation on dit n simply means that, for a dit n, the implied borrow out of the dit of next-higher significance (n+1) will indeed take place as assumed. The H signal will be set when the intermediate sum of dit n is a negative number, indicating that a borrow must occur. H will be set when $B_n < A_n$.

A G signal in subtraction corrects the implied borrow described above, if the borrow was unnecessary, by indicating that the intermediate difference for dit n should be incremented by one. In other words, a G signal indicates that the carry denoted by Y in Example 1 should occur to offset the unnecessary borrow denoted by data transfer W in Example 1. For elaboration, consider the example set forth in Table 10 below. Table 10 shows two consecutive dits in a subtract operation, the LSD and the dit of next-higher significance, dit n. The value of $B_{LSD}$ is 3, the value of $B_n$ is 1, the value of $A_{LSD}$ is 1, and the value of $A_n$ is 2.

TABLE 10

| | Step 1 | | Step 2 | | Step 3 | | Step 4 | | Step 5 | |
|---|---|---|---|---|---|---|---|---|---|---|
| | n | LSD | n | LSD | n | LSD | n | LSD | n | LSD |
| B | 1 | 3 | 11 | 3 | 10 | 13 | 10 | 13 | 10 | 13 |
| −A | 2 | 1 | 2 | 1 | 2 | 1 | 2 | 1 | 2 | 1 |
| Int. Diff. | — | | — | | — | | 2 | 12 | 3 | 2 |

The first step of Table 10 shows the two dits to be subtracted. Step 2 illustrates the borrow into dit n from the next-higher dit, dit n+1 (not shown), which results in a value of 11 for $B_n$. The value of 11 is the base four representation of 5 (i.e., 5 MOD 4), and 5 is the result of adding the borrowed four to the original value (1) of $B_n$. Step 2 therefore corresponds to the application of Assumption II to dit n, which is depicted as data transfer W in Example 1. Step 2 also corresponds to the application of Assumption I to dit n+1 (not shown).

The third step of Table 10 illustrates the borrow into LSD from dit n and shows that such borrow has two effects. First, the borrow decrements one from $B_n$, resulting in a value of 10 for $B_n$. This first effect corresponds to the application of Assumption I to dit n. Second, the borrow illustrated in Step 3 also results in the addition of four to the original value of $B_{LSD}$, with a resultant value of 7, which has a base four representation of 13. This second effect corresponds to the application of Assumption II to the LSD. Both effects are illustrated by data transfer X in Example 1.

The fourth step of Table 10 illustrates the result of ditwise subtraction on dit n and the LSD after the borrow assumptions have been applied. The intermediate difference for the LSD generates a carry because the result of the subtraction results in a value for the LSD that is greater than the base. The intermediate difference for the LSD is 12, which is the base four representation of 6.

Step 5 illustrates the carry from the LSD back into dit n. This carry corresponds to data transfer Z shown in Example 1. This carry will correct the initial borrow out of dit n that was illustrated in Step 1, and depicted as data transfer X in Example 1. In Step 5, the carry results in 1) the intermediate difference for dit n being incremented by one; and 2) the intermediate difference for the LSD being decremented by four, which is the base. The borrow from dit n into the LSD is unnecessary any time that $B_n > A_n$. Accordingly, the present invention sets the G bit to generate a carry any time $B_n > A_n$, thereby correcting unnecessary Assumption I borrows.

The P signal, for subtraction, means the same thing as it does for addition. That is, whether or not a carry will be generated out of dit n depends on whether there is a carry into dit n. P will be set when $B_n = A_n$.

The state of the H, P, and G wires for each combination of inputs into any dit of the present invention, except the LSD, is set forth in Table 11. FIG. 9 illustrates that the output of the standard subtraction HPG gate 900 conforms to Table 11.

TABLE 11

| B | B (1-of-4) | A | A (1-of-4) | ⁻A | ⁻A (1-of-4) | Pre-Corr. Diff (B − A) | Diff | H $B_n > A_n$ | P $B_n = A_n$ | G $B_n < A_n$ |
|---|---|---|---|---|---|---|---|---|---|---|
| 0 | 1000 | 0 | 1000 | 3 | 0001 | 3 | 0 | 0 | 1 | 0 |
| 1 | 0100 | 0 | 1000 | 3 | 0001 | 0* | 1 | 0 | 0 | 1 |
| 2 | 0010 | 0 | 1000 | 3 | 0001 | 1* | 2 | 0 | 0 | 1 |
| 3 | 0001 | 0 | 1000 | 3 | 0001 | 2* | 3 | 0 | 0 | 1 |
| 0 | 1000 | 1 | 0100 | 2 | 0010 | 2 | −1 | 1 | 0 | 0 |
| 1 | 0100 | 1 | 0100 | 2 | 0010 | 3 | 0 | 0 | 1 | 0 |
| 2 | 0010 | 1 | 0100 | 2 | 0010 | 0* | 1 | 0 | 0 | 1 |
| 3 | 0001 | 1 | 0100 | 2 | 0010 | 1* | 2 | 0 | 0 | 1 |
| 0 | 1000 | 2 | 0010 | 1 | 0100 | 1 | −2 | 1 | 0 | 0 |
| 1 | 0100 | 2 | 0010 | 1 | 0100 | 2 | −1 | 1 | 0 | 0 |
| 2 | 0010 | 2 | 0010 | 1 | 0100 | 3 | 0 | 0 | 1 | 0 |
| 3 | 0001 | 2 | 0010 | 1 | 0100 | 0* | 1 | 0 | 0 | 1 |
| 0 | 1000 | 3 | 0001 | 0 | 1000 | 0 | −3 | 1 | 0 | 0 |
| 1 | 0100 | 3 | 0001 | 0 | 1000 | 1 | −2 | 1 | 0 | 0 |
| 2 | 0010 | 3 | 0001 | 0 | 1000 | 2 | −1 | 1 | 0 | 0 |
| 3 | 0001 | 3 | 0001 | 0 | 1000 | 3 | 0 | 0 | 1 | 0 |

It is apparent from Table 11 that the H wire is asserted for each situation where $B_n < A_n$, so that every instance where the "Diff" column of Table 11 shows a negative number, a borrow is indicated because the H wire is asserted for that row. Table 11 also shows that any time the "Pre-corr. Diff" column of Table 11 indicates a carry, the G wire is asserted for that row. That is, G is asserted every time $B_n > A_n$.

Table 11(b) illustrates the HPG output of the four's complement gate 910 illustrated in FIG. 110. Gate 910 implements subtraction and borrow propagate logic for the LSD of the A and B operands. The output of gate 910 comprising a 1-of-3 HPG indicator conforms to Table 11(b).

increments the three's complement before adding the minuend to the subtrahend. Table 11(b) shows that, in all cases where a carry is generated, the G wire is asserted for four's complement addition.

In sum, the Level One gates, 900, 910 utilize N-NARY logic to set an HPG indicator based on the difference between one dit each of the A and B operands. FIG. 9 illustrates a standard subtraction/HPG gate 900 that implements three's complement arithmetic and that is used for all dits of the operands except the LSD. FIG. 10 illustrates an LSD subtraction/HPG gate 910 that sets an HPG indicator for the difference between the LSDs of each operand. FIG. 11 illustrates that this gate 910 is used to process the LSD, which always requires four's complement arithmetic for subtraction.

Second Level Block HPG Gates and Buffer

The second Logic Level is primarily concerned with one function: determining whether the subtraction operation of B−A has generated a carry out of each five-dit block and out TABLE 11(b)

| B | B (1-of-4) | A | A (1-of-4) | ⁻A | ⁻A + 1 | ⁻A + 1 (1-of-4) | Pre-Corr. Diff (B − A) | Diff (B − A) | H | P | G |
|---|---|---|---|---|---|---|---|---|---|---|---|
| 0 | 0001 | 0 | 0001 | 3 | 4 | 0001* | 0* | 0 | 0 | 0 | 1 |
| 1 | 0010 | 0 | 0001 | 3 | 4 | 0001* | 1* | 1 | 0 | 0 | 1 |
| 2 | 0100 | 0 | 0001 | 3 | 4 | 0001* | 2* | 2 | 0 | 0 | 1 |
| 3 | 1000 | 0 | 0001 | 3 | 4 | 0001* | 3* | 3 | 0 | 0 | 1 |
| 0 | 0001 | 1 | 0010 | 2 | 3 | 1000 | 3 | −1 | 0 | 1 | 0 |
| 1 | 0010 | 1 | 0010 | 2 | 3 | 1000 | 0* | 0 | 0 | 0 | 1 |
| 2 | 0100 | 1 | 0010 | 2 | 3 | 1000 | 1* | 1 | 0 | 0 | 1 |
| 3 | 1000 | 1 | 0010 | 2 | 3 | 1000 | 2* | 2 | 0 | 0 | 1 |
| 0 | 0001 | 2 | 0100 | 1 | 2 | 0100 | 2 | −2 | 1 | 0 | 0 |
| 1 | 0010 | 2 | 0100 | 1 | 2 | 0100 | 3 | −1 | 0 | 1 | 0 |
| 2 | 0100 | 2 | 0100 | 1 | 2 | 0100 | 0* | 0 | 0 | 0 | 1 |
| 3 | 1000 | 2 | 0100 | 1 | 2 | 0100 | 1* | 1 | 0 | 0 | 1 |
| 0 | 0001 | 3 | 1000 | 0 | 1 | 0010 | 1 | −3 | 1 | 0 | 0 |
| 1 | 0010 | 3 | 1000 | 0 | 1 | 0010 | 2 | −2 | 1 | 0 | 0 |
| 2 | 0100 | 3 | 1000 | 0 | 1 | 0010 | 3 | −1 | 0 | 1 | 0 |
| 3 | 1000 | 3 | 1000 | 0 | 1 | 0010 | 0* | 0 | 0 | 0 | 1 |

Table 11(b) shows that the H wire is asserted is set for four's complement addition any time that (B+1)<A. If B=A−1, then the P signal is set. Table 11(b) also shows that the G wire is asserted when A=B. These three conditions for asserting H, P, and G are true, and differ from the conditions shown in Table 11, because four's complement addition of the MSD. This logic is labeled as "Block HPG Logic" in FIG. 11. FIG. 11 illustrates that the Block HPG Logic comprises four gates—three block HPG gates 920, 955a, 955b and a buffer 951. The buffer 951 merely holds the HPG indicator generated by the subtraction of the MSD of the A operand from the MSD of the B operand. This indicator will be used by the Comparison Logic.

The three block HPG gates 920, 955a, 955b all perform the same general function. They determine whether an carry has been generated by the B–A operation within the five-dit block being processed by the block HPG gate. Gate 920 processes the LSBlk, which consists of Dit 0 through Dit 4. Gate 955a processes Block Two and Gate 955b processes Block Three. To say that a carry has been generated by the block means that either: 1) the B–A operation on the most significant A and B operand dits within the block has generated a carry OR 2) a carry was generated by the B–A operation on a set of operand dits of lesser significance within the block and that carry has propagated across every dit of greater significance within the block, including the block's most significant dit.

Figure 13:
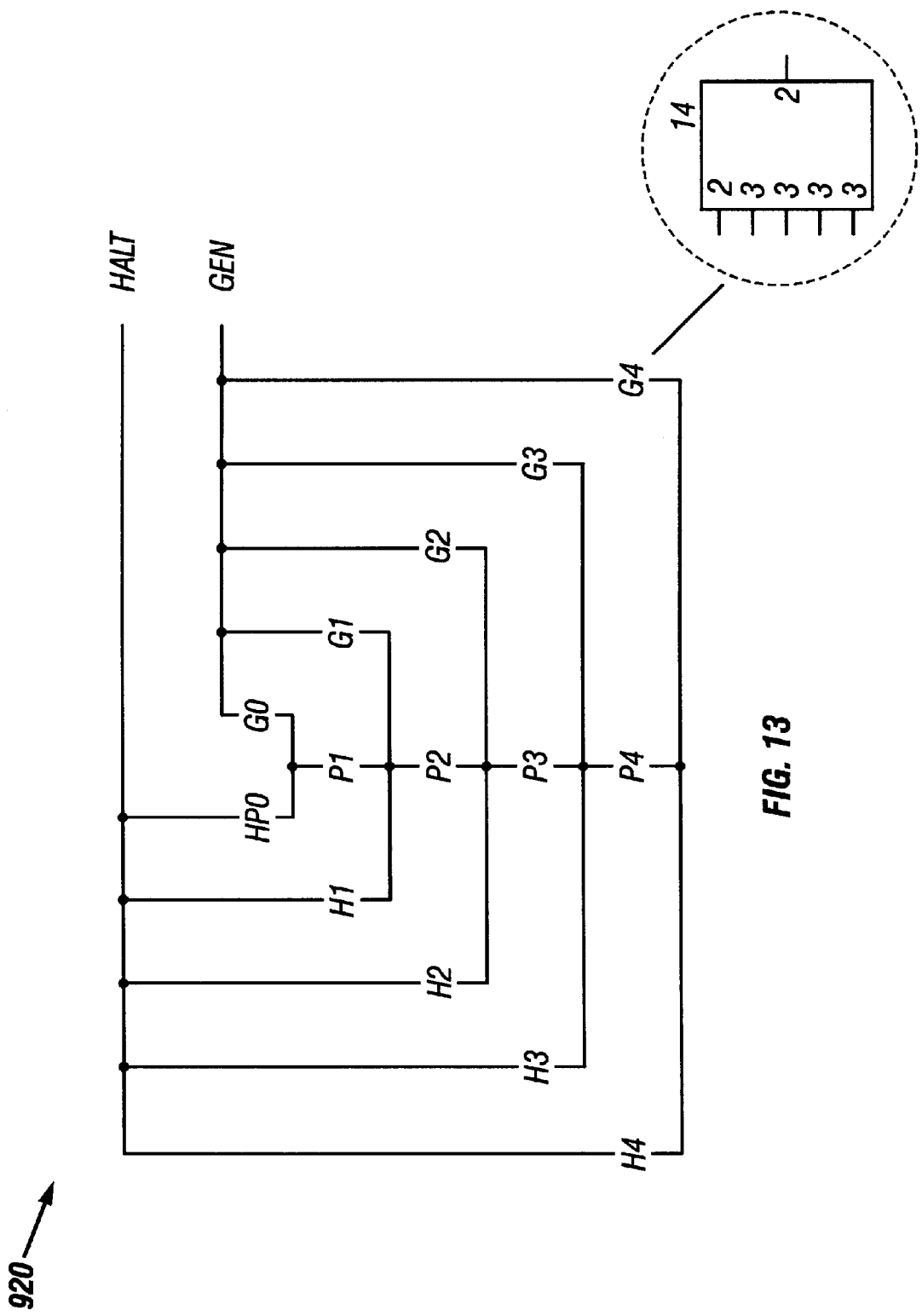
FIG. 13 is a shorthand representation of an N-NARY LSBlk block HPG gate.
Figure 14:
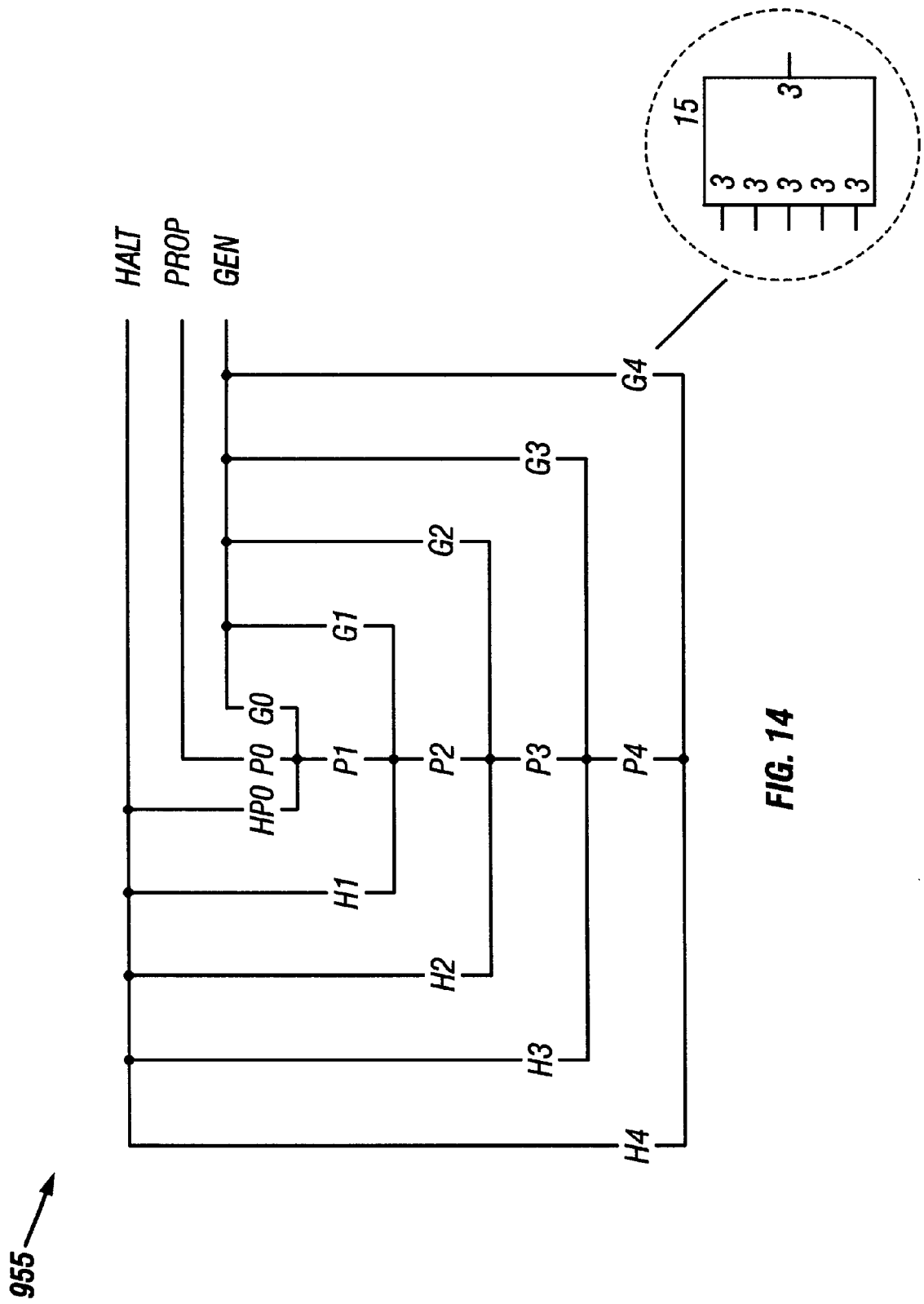
FIG. 14 shorthand representation of an N-NARY standard block HPG gate.

Gates 920 and 955 compute block-level HPG signals based on the individual HPG signals generated for each dit by the Subtraction Logic. FIGS. 13 and 14 illustrate that each block HPG gate 920, 955 receives five HPG indicators as inputs. FIG. 13 illustrates the block HPG gate 920 used in the LSBlk, while FIG. 14 illustrates the standard block HPG gate 955. FIG. 11 reflects that one of the 5 inputs into the LSBlk block HPG gate 920 is a 1-of-2 signal, the wires of which are labeled in FIG. 13 as HP0 and G0. In contrast, FIG. 14 illustrates that the standard block HPG gate 955 receives five 1-of-3 HPG input signals, each having an H wire, a P wire, and a G wire. This difference between the two gates 920, 955 stems from the fact that the HPG0 signal is the HPG indicator from the LSD, which combines the halt and propagate indicators since there is never a carry into the LSD.

The block HPG gates 920, 955 begin their processing with evaluation of the HPG indicator generated for the most significant dit of the block being processed, and proceed to dits of lesser significance as long as they encounter HPG signals with the P wire asserted. More specifically, the block HPG gates 920, 955 operate as follows. The first 1-of-3 input to be evaluated by each gate 920, 955 is the HPG4 indicator. The HPG4 indicator comprises three wires labeled in FIGS. 13 and 14 as H4, P4, and G4. FIG. 11 illustrates that the HPG4 signal delivers to gates 920 and 955 the HPG signal for the most significant dit within the block being processed. Specifically, the HPG4 indicator delivers to Gate 920 the HPG indicator for Dit 4. The HPG4 indicator delivers to Gate 955a the HPG indicator for Dit 9 and the HPG4 indicator delivers to Gate 955b the HPG indicator for Dit 14.

The second HPG input into the block HPG gates 920, 955 is noted as HPG3 in FIGS. 13 and 14. The HPG3 indicator comprises three wires labeled in FIGS. 13 and 14 as H3, P3, and G3. FIG. 11 illustrates that the HPG3 indicator delivers to the block HPG gates 920, 955 the HPG indicator for second-most significant dit within the block being processed. FIG. 11 illustrates that the HPG3 indicator delivers to Gate 920 the HPG indicator for Dit 3, delivers to Gate 955a the HPG indicator for Dit 8, and delivers to Gate 955b the HPG indicator for Dit 13.

This same pattern is followed for the remaining inputs into the block HPG gates 920, 955. The HPG2 input delivers to each block HPG gate 920, 955a, 955b the HPG indicator for the third-most significant dit within the block being processed (Dit 2, Dit 7, and Dit 12, respectively). Similarly, the HPG1 input delivers to each block HPG gate 920, 955a, 955b the HPG indicator for the second-least significant dit within the block being processed (Dit 1, Dit 6, and Dit 11, respectively). FIGS. 11 and 14 illustrate that the HPG0 input, a 1-of-3 input, delivers to Gate 955 the HPG indicator for the LSD within the block being processed—Dit 5 for Gate 955a and Dit 10 for Gate 955b. FIG. 13 illustrates that the HPG0 input is a 1-of-2 indicator that delivers to Gate 920 the 1-of-2 HPG indicator for the LSD, Dit 0.

FIGS. 13 and 14 illustrate that if the H4 wire is asserted, signifying a halt indication from MSD of the block, then the HALT output wire is asserted. If the G4 signal is asserted, signifying a generate signal from the MSD of the block, then the GEN output wire is asserted. If the P4 input wire is asserted, then the HPG indicator for the dit of next-lesser significance within the block, HPG3, must be evaluated. FIGS. 13 and 14 illustrate that if P4 and H3 wires are asserted then a halt indicator has propagated from the block's second-most significant dit across the block's MSD. In such a case, the block HPG gates 920, 955 assert a HALT output indicator. If P4 and G3 are asserted, then a generate indicator has propagated from the block's dit of second-highest significance across the block's MSD. In such a case, the block HPG gates 920, 955 assert a GEN output indicator.

If P4 and P3 are both asserted, then the HPG indicator from the block's third-most significant dit, HPG2, must be examined. Generally, if the block HPG gates 920, 955 ever encounter an HPG indicator with the G wire asserted, then a GEN output is asserted. If the P4, P3, and G2 wires are asserted, then the block HPG gates 920, 955 therefore assert a GEN output. Similarly, if the P4, P3, P2, and G1 wires are asserted, the block HPG gates 920, 955 assert a GEN output.

Similarly, if the block HPG gates 920, 955 ever encounter an HPG indicator with the H wire asserted, then a HALT output is asserted. If the P4, P3, and H2 wires are asserted, then the block HPG gates 920, 955 therefore assert a HALT output. If the P4, P3, P2, and P1 wires are asserted, and the G0 wire is not asserted, FIGS. 13 and 14 illustrate that the two block HPG gates 920, 955 then perform slightly different processing.

Processing of the HPG0 indicator in the instance where P4, P3, P2, and P1 are all asserted differs in the two block HPG gates 920, 955 due to the compressed nature of the HPG indicator for the LSD. The LSD subtraction HPG gate 910 in the Subtraction Logic produces a 1-of-2 HPG indicator that compresses the H and P wires since there will never be a carry into the LSD and the H and P indicators therefore have precisely the same meaning—no carry is generated by the B–A operation in the LSD's of the A and B operands. FIG. 14 illustrates that, if P4, P3, P2, and P1 are all asserted, then the standard block HPG gate 955 will assert a HALT output if H0 is asserted, will assert a PROP output if P0 is asserted, and will assert a GEN output if the G0 wire is asserted. In contrast, the LSBlk block HPG gate 920 will assert the HALT wire of Gate 920's 1-of-2 output indicator if P4, P3, P2, P1, and HP0 are all asserted. As indicated above, both the LSBlk block HPG gate 920 and the standard block HPG gate 955 will assert a GEN output if P4, P3, P2, P1, and G0 are asserted. For Gate 955, the GEN output comprises one wire of the gate's 1-of-3 output. For Gate 920, the GEN output comprises one wire of the gate's 1-of-2 output.

Figure 15:
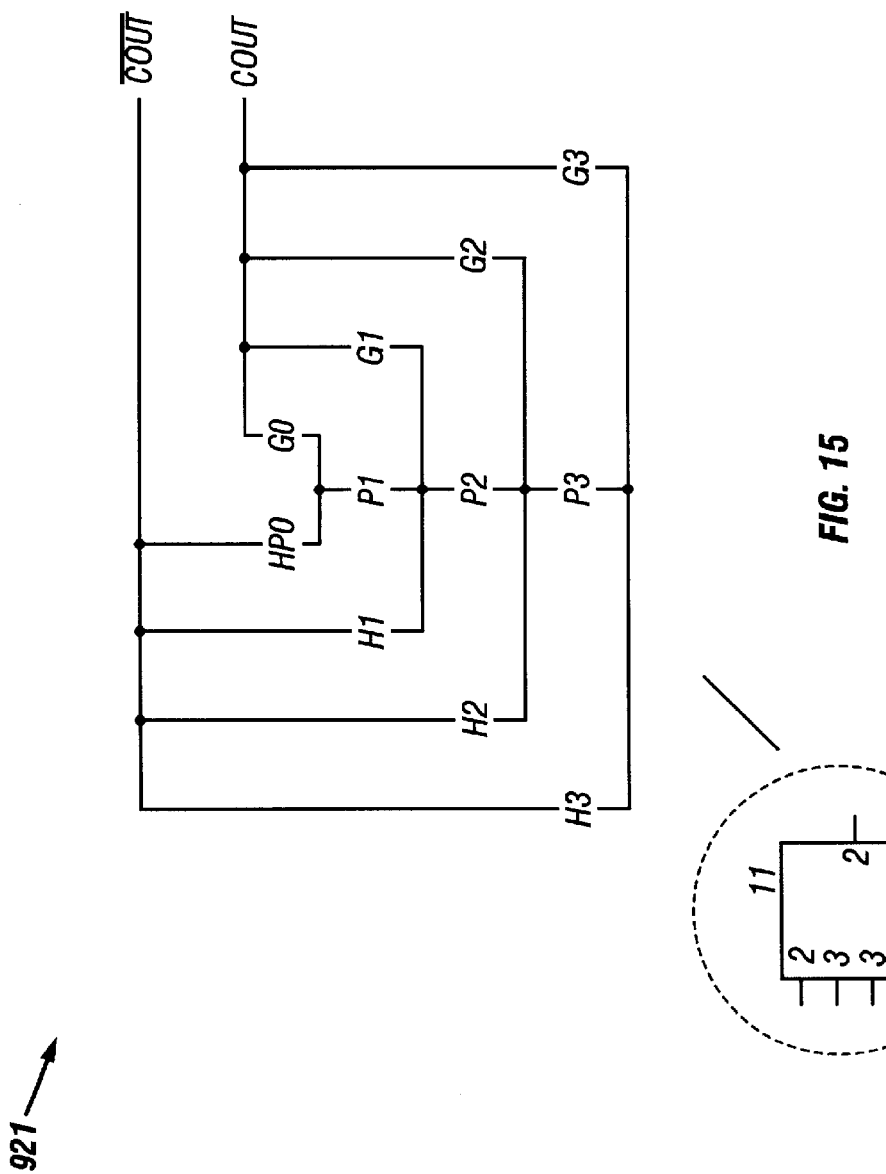
FIG. 15 is a shorthand representation of an N-NARY comparison gate.

FIG. 11 illustrates that the block HPG output indicator from each of the block HPG gates 920, 955a, 955b is an input into the third Logic Level comparison gate 921, as is the MSD HPG indicator stored in Buffer 951. FIGS. 11 and 15 illustrate that the output from Buffer 951 is labeled in FIG. 15 as the 1-of-3 HPG3 input into Gate 921. The 1-of-3 block HPG output from standard block HPG gate 955b is labeled in FIG. 15 as the 1-of-3 HPG2 input into Gate 921. The 1-of-3 block HPG output from standard block HPG gate 955a is labeled in FIG. 15 as the 1-of-3 HPG1 input into Gate 921. Finally, the 1-of-2 output from the LSBlk block HPG gate 920 is labeled in FIG. 15 as the 1-of-2 HPG0 input into Gate 921. The comparison gate's 921 operation concerning these inputs is described below.

Third Level Comparison Gate

FIG. 11 illustrates that sole gate of the third Logic Level, the Comparison Logic, is the comparison gate 921. The comparison gate 921 of the preferred embodiment of the present invention is illustrated in FIG. 15. The function of the comparison gate 921 is to determine whether the operation of B−A generates a carry. FIG. 15 illustrates that the output of the comparison gate 921 is a 1-of-2 carry out signal. One wire of the carry out signal is the carry out indicator, Cout, and the other wire is the no carry indicator, $\overline{Cout}$. FIG. 15 illustrates that the comparison gate 921 receives three 1-of-3 HPG indicators and one 1-of-2 HPG indicator as inputs. The first input, referred to in FIG. 15 as HPG3, is the 1-of-3 HPG indicator generated by Subtraction Logic gate 900o for the MSD and stored by Buffer 951 in the Block HPG Logic. The second input into the comparison gate 921, referred to in FIG. 15 as HPG2, is the block HPG indicator generated by the block HPG gate 955b for Block Three during the Block HPG Logic. The third input into the comparison gate 921, referred to in FIG. 15 as HPG1, is the block HPG indicator generated by the block HPG gate 955a for Block Two during the Block HPG Logic. Finally, the fourth input into the comparison gate 921, referred to in FIG. 15 as HP0/G0, is the block HPG indicator generated by LSBlk block HPG gate 920 for the LSBlk during the Block HPG Logic.

FIG. 15 illustrates that the comparison gate 921 asserts the $\overline{Cout}$ output wire if H3 is asserted, indicating that no carry is generated. If the comparison gate 921 detects that G3 is asserted, FIG. 15 illustrates that the gate 921 then asserts the Cout output wire, indicating a carry. As with the block HPG gates 920, 955 described above, the HPG indicator for the block of lesser significance is evaluated when a P indicator is asserted. FIG. 15 illustrates that the comparison gate 921 asserts its output wires based on the following logic equations:

$$Cout=G3|P3*G2|P3*P2*G1|P3*P2*P1*G0$$

$$\overline{Cout}=H3|P3*H2|P3*P*H1|P3*P2*P1*HP0$$

The setting of the Cout indicator signifies that 1) a carry is indicated for the MSD OR 2) a carry has propagated out of a block of lesser significance and has propagated across all intervening dits of greater significance, including the MSD.

In sum, the preferred embodiment of the present invention receives as inputs two 1-of-4 32-bit operands. For each dit of the operands, the present invention determines whether the dit-wise subtraction of B−A generates a carry. The first Logic Level, the Subtraction Logic, generates an HPG indicator to indicate whether a carry is generated for each such ditwise subtraction. The HPG indicator generated for the ditwise subtraction of the MSD of each operand is stored by a buffer in the second Logic Level, the Block HPG Logic. This second Logic Level also performs block HPG processing to produce a block HPG output indicator for each five-dit block: LSBlk, Block Two, and Block Three. In the Comparison Logic, the third Logic Level, a comparison gate receives each block HPG indicator as well as the MSD HPG indicator and determines whether the subtraction of operand A from operand B generates a carry. If the carry output wire, Cout, is asserted, then the value of the B operand is greater than or equal to the value of the A operand. If the no carry output wire, $\overline{Cout}$, is asserted, then the value of the B operand is less than the value of the A operand.

Other embodiments of the invention will be apparent to those skilled in the art after considering this specification or practicing the disclosed invention. The specification and examples above are exemplary only, with the true scope of the invention being indicated by the following claims.

We claim:

1. An apparatus that compares the values of two N-NARY operands, comprising:
   a 1-of-P first input that receives a 1-of-P first operand;
   a 1-of-Q second input that receives a 1-of-Q second operand;
   a 1-of-R result output that delivers a 1-of-R result;
   a subtraction logic, coupled to said first input and to said second input, that produces an HPG indicator based on the difference between said second operand and said first operand;
   a block HPG logic, coupled to said subtraction logic, that produces a block HPG indicator; and
   a comparison logic, coupled to said block HPG logic and to said result output, that produces said 1-of-R result, where said 1-of-R result comprises a carry value if the value of said first operand is less than or equal to the value of said second operand, said 1-of-R result further comprises a no carry value if the value of said first operand is greater than the value of said second operand.

2. The apparatus of claim 1 wherein P and Q equal four and wherein R equals two.

3. An system for comparing the values of two N-NARY operands, comprising:
   a 1-of-P first input that receives a 1-of-P first operand;
   a 1-of-Q second input that receives a 1-of-Q second operand;
   a 1-of-R result means for delivering a 1-of-R result;
   a subtraction logic means, coupled to said first input and to said second input, for producing an HPG indicator based on the difference between said second operand and said first operand;
   a block HPG logic means, coupled to said subtraction logic means, for producing a block HPG indicator; and
   a comparison logic means, coupled to said block HPG logic means and to said result means, for producing said 1-of-R result, where said 1-of-R result comprises a carry value if the value of said first operand is less than or equal to the value of said second operand, said 1-of-R result further comprises a no carry value if the value of said first operand is greater than the value of said second operand.

4. The system of claim 3 wherein P and Q equal four and wherein R equals two.

5. An method to manufacture an apparatus that compares the values of two N-NARY operands, comprising:
   providing a 1-of-P first input that receives a 1-of-P first operand;
   providing a 1-of-Q second input that receives a 1-of-Q second operand;
   providing a 1-of-R result output that delivers a 1-of-R result;
   providing a subtraction logic that produces an HPG indicator based on the difference between said second operand and said first operand;
   coupling said first input and said second input to said subtraction logic;
   providing a block HPG logic that produces a block HPG indicator;

coupled said block HPG logic to said subtraction logic;

providing a comparison logic that produces said 1-of-R result, where said 1-of-R result comprises a carry value if the value of said first operand is less than or equal to the value of said second operand, said 1-of-R result further comprises a no carry value if the value of said first operand is greater than the value of said second operand; and coupling said comparison logic to said block HPG logic and to said result output.

6. The method of claim 5 wherein P and Q equal four and wherein R equals two.

7. A method to compare the values of two N-NARY operands, comprising:

receiving a 1-of-P first operand;

receiving a 1-of-Q second operand;

producing an HPG indicator based on the difference between said second operand and said first operand;

producing a block HPG indicator; and producing a 1-of-R result, where said 1-of-R result comprises a carry value if the value of said first operand is less than or equal to the value of said second operand, said 1-of-R result further comprises a no carry value if the value of said first operand is greater than the value of said second operand.

8. The method of claim 7 wherein P and Q equal four and wherein R equals two.

* * * * *